(12) United States Patent
Vanderwees et al.

(10) Patent No.: US 11,209,216 B2
(45) Date of Patent: Dec. 28, 2021

(54) ULTRA THIN HEAT EXCHANGERS FOR THERMAL MANAGEMENT

(71) Applicant: Dana Canada Corporation, Oakville (CA)

(72) Inventors: Doug Vanderwees, Oakville (CA); Shuding Lin, Oakville (CA); Mike St. Pierre, Oakville (CA)

(73) Assignee: Dana Canada Corporation

( * ) Notice: Subject to any disclaimer, the term of this patent is extended or adjusted under 35 U.S.C. 154(b) by 224 days.

(21) Appl. No.: 16/047,484

(22) Filed: Jul. 27, 2018

(65) Prior Publication Data

US 2019/0033006 A1 Jan. 31, 2019

Related U.S. Application Data

(60) Provisional application No. 62/538,010, filed on Jul. 28, 2017.

(51) Int. Cl.
*F28D 15/02* (2006.01)
*F28D 15/04* (2006.01)
(Continued)

(52) U.S. Cl.
CPC ..... *F28D 15/0283* (2013.01); *F28D 15/0266* (2013.01); *F28D 15/043* (2013.01);
(Continued)

(58) Field of Classification Search
CPC ............ F28D 15/0266; F28D 15/0283; F28D 15/043; F28D 15/046; F28F 21/084;
(Continued)

(56) References Cited

U.S. PATENT DOCUMENTS

| 5,045,668 A | 9/1991 | Neiheisel |
|---|---|---|
| 6,011,240 A | 1/2000 | Bishop |

(Continued)

FOREIGN PATENT DOCUMENTS

| CN | 1383204 A | 12/2002 |
|---|---|---|
| CN | 1494138 A | 5/2004 |

(Continued)

OTHER PUBLICATIONS

Canadian Intellectual Property Office, International Search Report and Written Opinion Issued In Application PCT/CA2018/050915, dated Oct. 4, 2018, 14 pages, Canadian Patent Office, Gatineau Quebec.

(Continued)

*Primary Examiner* — Len Tran
*Assistant Examiner* — Gustavo A Hincapie Serna
(74) *Attorney, Agent, or Firm* — McCoy Russell LLP

(57) ABSTRACT

A heat exchanger for cooling a heat-generating component includes first and second plates, each having a core layer of a first metal and an inner clad layer of a lower melting second metal, which is inert to the working fluid contained in a fluid chamber of the heat exchanger. The outer peripheral sealing surfaces of the first and second plates are joined by welding, wherein the weld joint is fluidly isolated from the fluid chamber by a layer of the second metal in an area adjacent to the weld joint. In some embodiments, the heat exchanger includes liquid flow passages and primary and secondary gas flow passages, each secondary passage providing communication between primary gas flow passages. The gas and liquid flow passages may be defined by a wick material having hydrophilic areas and non-wicking areas of reduced thickness. A method of manufacturing is also disclosed.

19 Claims, 13 Drawing Sheets

(51) Int. Cl.
   *H01L 23/427* (2006.01)
   *F28F 21/08* (2006.01)
(52) U.S. Cl.
   CPC .......... *F28D 15/046* (2013.01); *F28F 21/084* (2013.01); *F28F 21/085* (2013.01); *F28F 21/087* (2013.01); *H01L 23/427* (2013.01); *F28F 2275/067* (2013.01)
(58) Field of Classification Search
   CPC .. F28F 21/085; F28F 21/087; F28F 2275/067; H01L 23/427; H01L 23/4275; H01L 23/44–445; H01L 23/46–4735
   USPC .................................................... 165/104.26
   See application file for complete search history.

(56) References Cited

U.S. PATENT DOCUMENTS

| | | | |
|---|---|---|---|
| 6,082,443 A * | 7/2000 | Yamamoto | F28D 15/0233 165/104.21 |
| 6,269,870 B1 | 8/2001 | Banzhaf | |
| 6,474,074 B2 | 11/2002 | Ghoshal | |
| 6,479,168 B2 | 11/2002 | Mazumder | |
| 6,681,151 B1 | 1/2004 | Weinzimmer | |
| 6,896,039 B2 * | 5/2005 | Dussinger | B22F 3/11 165/104.21 |
| 6,942,018 B2 | 9/2005 | Goodson | |
| 6,957,692 B1 * | 10/2005 | Win-Haw | F28D 15/0233 165/104.21 |
| 7,137,442 B2 | 11/2006 | Kawahara | |
| 7,218,519 B2 * | 5/2007 | Prasher | H01L 23/473 165/104.33 |
| 7,447,029 B2 * | 11/2008 | Lai | H01L 23/427 165/104.21 |
| 7,650,931 B2 | 1/2010 | Siu | |
| 8,038,048 B2 | 10/2011 | Nielsen | |
| 8,042,606 B2 | 10/2011 | Batty | |
| 8,353,334 B2 * | 1/2013 | Zhao | F28D 15/046 165/104.26 |
| 8,857,699 B2 | 10/2014 | Sjodin | |
| 8,944,307 B2 | 2/2015 | Kawamura | |
| 9,291,398 B2 * | 3/2016 | Yang | H01L 23/427 |
| 9,381,597 B2 | 7/2016 | Stermann | |
| 9,423,187 B2 | 8/2016 | Fan | |
| 9,423,192 B2 * | 8/2016 | Tsoi | F28D 15/0233 |
| 9,610,675 B2 | 4/2017 | Southwell | |
| 9,939,204 B2 | 4/2018 | Phan | |
| 10,502,496 B2 * | 12/2019 | Yang | H01L 23/427 |
| 2004/0040696 A1 * | 3/2004 | Cho | H01L 23/427 165/104.26 |
| 2006/0096740 A1 * | 5/2006 | Zheng | F28D 15/0233 165/104.26 |
| 2007/0012431 A1 * | 1/2007 | Miyahara | F28D 15/0233 165/170 |
| 2007/0015671 A1 | 1/2007 | Naumovski | |
| 2010/0032141 A1 | 2/2010 | Heydari | |
| 2010/0071879 A1 * | 3/2010 | Hou | F28D 15/046 165/104.26 |
| 2010/0157535 A1 | 6/2010 | Oniki | |
| 2010/0206768 A1 | 8/2010 | Hofmann | |
| 2011/0002109 A1 | 1/2011 | Hauschild | |
| 2011/0284511 A1 | 11/2011 | Boynton | |
| 2011/0303392 A1 | 12/2011 | Horiuchi | |
| 2013/0306274 A1 | 11/2013 | Yang | |
| 2013/0306275 A1 | 11/2013 | Yang | |
| 2014/0144024 A1 * | 5/2014 | Byrne, II | B23K 20/122 29/897.2 |
| 2014/0174700 A1 * | 6/2014 | Lin | F28D 15/046 165/104.26 |
| 2015/0119111 A1 * | 4/2015 | Honmura | H04M 1/026 455/566 |
| 2015/0129177 A1 | 5/2015 | Pai | |
| 2015/0204617 A1 | 7/2015 | Thanhlong | |
| 2016/0010927 A1 | 1/2016 | Ahamed | |
| 2016/0018165 A1 | 1/2016 | Ahamed | |
| 2016/0018166 A1 | 1/2016 | Ahamed | |
| 2016/0091258 A1 | 3/2016 | Ahamed | |
| 2016/0270951 A1 | 9/2016 | Martins | |
| 2016/0282914 A1 | 9/2016 | Saito | |
| 2016/0290734 A1 * | 10/2016 | Osenbach | H01L 21/4882 |
| 2016/0290739 A1 | 10/2016 | Mochizuki | |
| 2016/0295739 A1 | 10/2016 | Ahamed | |
| 2017/0023306 A1 | 1/2017 | Stavi | |
| 2017/0055372 A1 | 2/2017 | Ahamed | |
| 2017/0076874 A1 | 3/2017 | O'Phelan | |
| 2017/0227297 A1 * | 8/2017 | Wang | F28D 15/04 |
| 2017/0248378 A1 * | 8/2017 | Aoki | B23K 11/02 |
| 2018/0320997 A1 * | 11/2018 | He | F28D 15/0283 |
| 2020/0049421 A1 * | 2/2020 | Wakaoka | F28F 3/02 |
| 2020/0080791 A1 * | 3/2020 | Yokoyama | F28D 15/0233 |

FOREIGN PATENT DOCUMENTS

| | | | |
|---|---|---|---|
| CN | 1507380 A | | 6/2004 |
| CN | 1878454 A | | 12/2006 |
| CN | 1892164 A | | 1/2007 |
| CN | 101890576 | | 11/2010 |
| CN | 201960269 | | 9/2011 |
| CN | 102369078 A | | 3/2012 |
| CN | 202240143 | | 5/2012 |
| JP | 3192932 | | 9/2014 |
| JP | 2016-247075 A | * | 12/2016 |
| JP | 5922826 | | 12/2016 |
| JP | 2017003160 | | 1/2017 |
| JP | 3209501 U | | 3/2017 |
| JP | 6216383 | | 3/2017 |
| JP | 2017202710 | | 11/2017 |
| KR | 100352789 | | 7/2001 |
| WO | 03098141 A1 | | 11/2003 |
| WO | 2018116951 | | 6/2018 |

OTHER PUBLICATIONS

English Machine Translation of JP5922826 (12 pages).
English Machine Tranlsation of JP2017003160 (10 pages).
English Machine Translation of JP6216383 (17 pages).
English Machine Translation of WO2018116951 (18 pages).
Canadian Intellectual Property Office, International Search Report and written opinion issued in application PCT/CA2018/050917, dated Oct. 23, 2018, 9 pages, Canadian Patent Office, Gatineau Quebec.
Patschger, Andreas et al., "New approach to clamping in microwelding" Journal of Laser Applications, vol. 27, Issue No. S2, pp. S29013-1 to S29013-8, Feb. 2015.
Patschger, Andreas, et al., "Process-limiting Factors and Characteristics of Laser-based Micro welding", Physics Procedia V. 56, pp. 740-749 1, Jan. 2014.

* cited by examiner

ULTRA THIN HEAT EXCHANGERS FOR THERMAL MANAGEMENT

FIELD

The present disclosure generally relates to thermal management of heat-generating electronic components, such as computer chips in personal electronic devices such as smart phones, tablets and computers, and specifically to ultra-thin heat transfer devices for personal electronic devices, and methods for their manufacture.

BACKGROUND

The heat generated by computer chips and/or other heat-generating components in personal electronic devices must be dissipated to maintain high processing speeds and to avoid high temperatures which may cause damage to the device or discomfort to the user. For example, 43° C. is specified as the maximum skin contact temperature for a handheld device and, for computer chips, temperatures above about 75-85° C. may significantly impact lifetime and performance. Heat dissipation is of greater concern as chip sizes continue to decrease and processing speeds increase, resulting in increased power densities and greater heat generation per unit area.

Some personal electronic devices incorporate thin heat-spreading devices such as planar sheets of graphite and/or copper, and/or heat pipes mounted on planar sheets, to spread and dissipate the heat generated by the computer chip over the area of the device. It is believed that the effectiveness of these existing technologies may not be sufficient to deal with the increased power densities of future generations of computer chips.

Compact cooling devices are known in which the heat of the computer chip is transported away from the chip as latent heat of evaporation. These devices are known as "vapor chambers", and have a flat, planar, panel-like structure with an internal chamber containing a working fluid. The vapor chamber spreads heat energy received at a local area as uniformly as possible throughout its entire area, thereby acting like an extended fin surface for conducting or convecting the energy away from the computer chip.

The local area of the vapor chamber which is in contact with the computer chip and/or other heat-generating component contains working fluid in the liquid state. Heat from the computer chip is transferred to the working fluid, which is vaporized and circulated through internal gas flow passages to cooler areas of the vapor chamber, where its temperature drops and it uses the larger fin area to condense, releasing the heat of condensation in areas away from the chip. The condensed working fluid is then wicked back to the area of the chip by capillary flow to repeat the cycle. An example of a vapor chamber is disclosed in Publication No. US 2016/0290739 A1 by Mochizuki et al.

Vapor chambers are commonly constructed from a pair of copper sheets enclosing a wicking element, with the sheets being joined together by diffusion bonding. Copper is pliable and expensive, making it difficult to economically produce parts which are sufficiently rigid and meet industry thickness requirements. Also, diffusion bonding is a slow batch process, and each part can require several hours to produce. Thus, the use of diffusion bonding for mass production of vapor chambers is uneconomical.

There remains a need for improved heat exchangers which are sufficiently rigid, thin, durable and inexpensive to manufacture, as well as manufacturing methods to achieve these objectives.

SUMMARY

In one aspect, there is provided a heat exchanger for cooling a heat-generating component. The heat exchanger has an upper surface adapted for thermal contact with the heat-generating component, an opposed lower surface, and an interior defining a fluid chamber containing a working fluid.

The heat exchanger comprises: (a) a first plate having an inner face which faces toward the interior of the fluid chamber, an outer face which defines either the upper or lower surface of the heat exchanger, and an outer peripheral sealing surface on the inner face of the first plate; and (b) a second plate having an inner face which faces toward the interior of the fluid chamber, an outer face which defines either the upper or lower surface of the heat exchanger, and an outer peripheral sealing surface on the inner face of the second plate.

Each of the first plate and the second plate comprises a core layer comprising a first metal and an inner clad layer comprising a second metal, wherein the inner clad layer is provided along the inner face of each first and second plate. A melting temperature of the second metal is lower than that of the first metal, and the second metal is inert to the working fluid. The outer peripheral sealing surfaces of the first and second plates are sealingly joined together, with a weld joint being formed through the outer peripheral sealing surfaces of the first and second plates, wherein the weld joint comprises an alloy of the first metal and the second metal.

Narrow areas are located immediately adjacent to the weld joint in which the peripheral sealing surfaces of the first and second plates are sealingly joined together by a layer of the second metal, the narrow areas comprising a heat-affected zone. The weld joint is fluidly isolated from an outer peripheral edge of the fluid chamber by the layer of the second metal in the heat-affected zone.

In another aspect, there is provided a method for manufacturing a heat exchanger as described herein. The method comprises: (a) forming a plate assembly comprising the first plate and the second plate, wherein the first and second plates are positioned with their inner faces facing toward one another, and with the peripheral sealing surface of the first plate in direct contact with the peripheral sealing surface of the second plate; (b) directing a laser beam at an area of the plate assembly along the sealing surfaces between an outer peripheral edge of the plate assembly and an outer edge of the fluid chamber, wherein the laser beam produces a narrow fusion zone in the area where it strikes the sealing surfaces of the plates, the fusion zone extending through one of the first and second plates and at least partially through the adjoining one of the first and second plates, wherein the fusion zone contains a molten metal mixture comprising the first metal and the second metal; and (c) allowing the fusion zone to cool and solidify to form a weld joint between the first and second plates.

During step (b) the heat of the laser beam at least partly melts and fuses together the second metal of the inner clad layers of the first and second plates in a heat affected zone located immediately adjacent to the weld joint.

During step (c) the molten second metal in the heat-affected zone solidifies to form a solid layer of the second metal in the heat affected zone, wherein the layer of second metal fluidly isolates the weld joint from contact with the working fluid in the fluid chamber.

In another aspect, there is provided a heat exchanger for cooling a heat-generating component, the heat exchanger having an upper surface adapted for thermal contact with the heat-generating component, an opposed lower surface, and an interior defining a fluid chamber containing a working fluid. The heat exchanger comprises: (a) a first plate having an inner face which faces toward the interior of the fluid chamber, an outer face which defines either the upper or lower surface of the heat exchanger, and an outer peripheral sealing surface on the inner face of the first plate; (b) a second plate having an inner face which faces toward the interior of the fluid chamber, an outer face which defines either the upper or lower surface of the heat exchanger, and an outer peripheral sealing surface on the inner face of the second plate, wherein an evaporation zone is defined in the interior of the fluid chamber, inbetween the first and second plates, wherein the evaporation zone directly opposes an area of the upper surface which is in contact with the heat-generating component; (c) a plurality of primary gas flow passages for circulation of the working fluid in a gaseous state, each of the primary gas flow passages having a first end and a second end, the first ends of the plurality of primary gas flow passages opening being in open flow communication with one another in the evaporation zone, and the second end of each primary gas flow passage being distal from the first end; (d) a plurality of liquid flow passages for circulation of the working fluid in a liquid state; and (e) at least one secondary gas flow passage, each of which provides flow communication between the second end of one of the primary gas flow passages and at least one of the other primary gas flow passages.

The second end of each primary gas flow passage is in flow communication with at least one other primary gas flow passage through the at least one secondary gas flow passage; and all the primary gas flow passages in the plurality of primary gas flow passages are interconnected with one another through the at least one secondary gas flow passages, optionally through one or more of the primary gas flow passages.

In an embodiment, the evaporation zone is located at or proximate to a first end of the heat exchanger, and the second ends of at least some of the primary gas flow passages are located proximate to a second end of the heat exchanger, longitudinally spaced from the evaporation zone; and wherein the at least one secondary gas flow passage includes a portion which extends generally transversely across the heat exchanger proximate to the second end and fluidly connects the second ends of all of the primary gas flow passages having their second ends located proximate to the second end of the heat exchanger.

In an embodiment, the liquid flow passages are defined by a wick material received inside the fluid chamber between the inner face of the first plate and the inner face of the second plate, wherein the wick material in the liquid flow passages has a first porosity and a first height, the first porosity being sufficient to permit wicking and capillary flow of the liquid working fluid through the liquid flow passages, and the first height being such that the wick material is in contact with the inner surfaces of the first and second plates along its upper and lower surfaces in the liquid flow passages; and wherein the primary gas flow passages are defined by spaces between the strips of wick material.

In an embodiment, the secondary gas flow passages are defined by spaces between the strips of wick material. In another embodiment, the secondary gas flow passages comprise areas of the wick material in which the wick material has a second porosity which is less than the first porosity and a second height which are less than the first height, wherein the second porosity is insufficient to provide wicking and capillary flow of the liquid working fluid, and the second height is such that it the wick material occupies only a portion of the height of fluid chamber in the secondary gas flow passages, thereby permitting the gaseous working fluid to flow over and/or under the wick material in the secondary gas flow passages.

BRIEF DESCRIPTION OF THE DRAWINGS

Specific embodiments will now be described, by way of example only, with reference to the accompanying drawings, in which.

DETAILED DESCRIPTION

Figure 1:
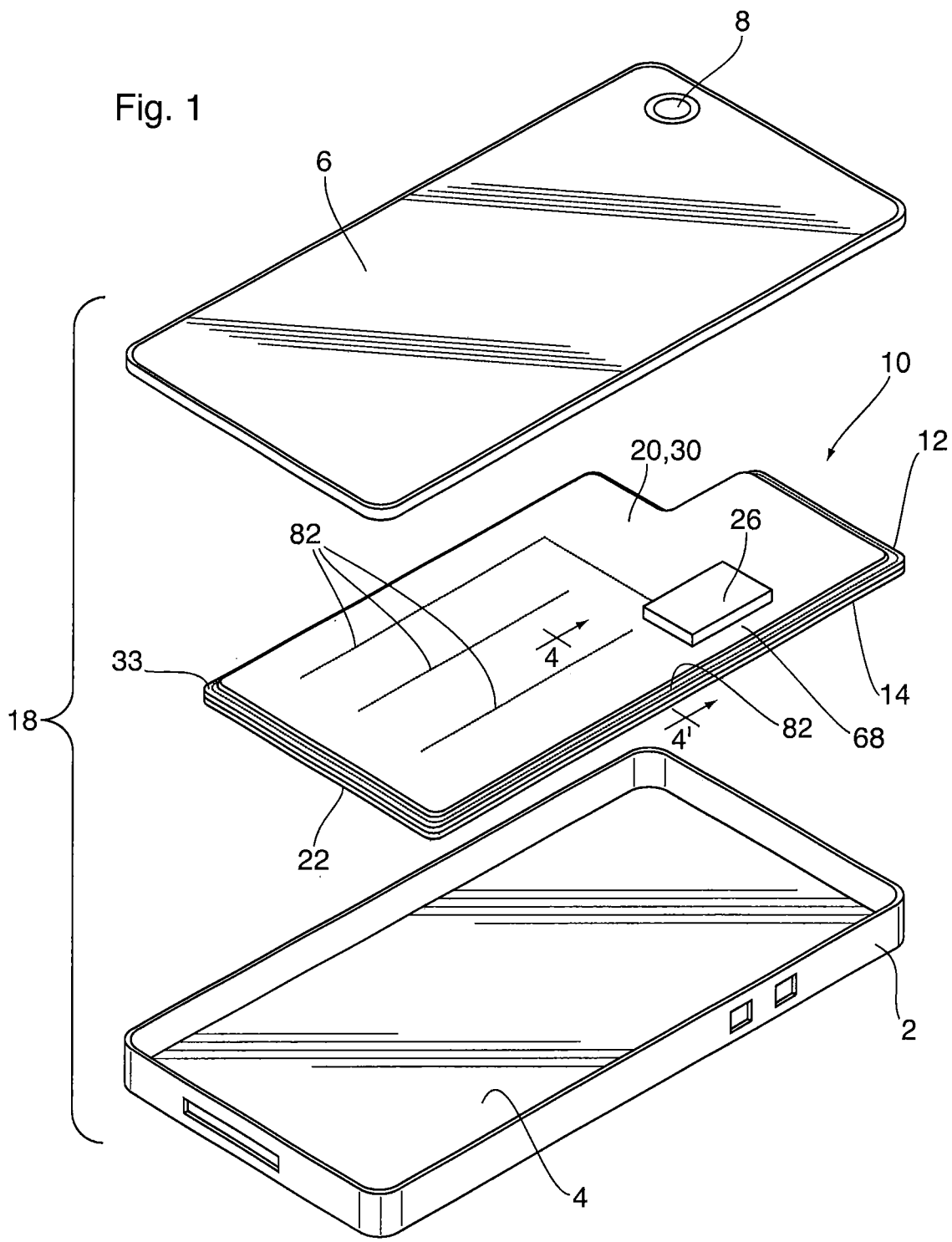
FIG. 1 is a top perspective view of a heat exchanger according to an embodiment described herein.

A number of embodiments of heat exchangers are described in the following description, along with descriptions of methods for manufacturing the heat exchangers. The embodiments specifically disclosed herein are vapor chambers for cooling electronic devices, however, the structural details and manufacturing methods disclosed herein may also be applicable to other types of heat exchangers.

The drawings illustrate a heat exchanger 10 according to a first embodiment, wherein the heat exchanger 10 is a vapor chamber comprising a first plate 12, a second plate 14 and a wick material 16.

The vapor chamber 10 has an outer peripheral size and shape such that it will fit within the casing of a personal electronic device 18, the casing comprising a main body 2 having a front cover 4, and a rear cover 6 which fits over the open rear face of the front cover 4. The personal electronic device 18 may for example comprise a smart phone, a tablet, a laptop or other personal computing and/or communications device. The vapor chamber 10 is generally flat and planar, having an upper surface 20 and a lower surface 22, and having a thickness ranging from about 200-2,000 micrometers, depending on the specific nature of the personal electronic device 18. For example, where the personal electronic device 18 is a relatively small device such as a smart phone, the thickness of vapor chamber 10 may be from about 200-400 micrometers. The vapor chambers 10 of larger devices such as tablets and laptops may be thicker than those of a smart phone. The vapor chamber 10 may include one or more cutouts 24 to accommodate elements of the personal electronic device 18, such as a camera lens 8, which is provided in the rear cover 6 shown in FIG. 1.

Although vapor chamber 10 is shown in the drawings as being thin and generally flat, planar and rectangular, the vapor chambers disclosed and claimed herein are not required to have this configuration. The configuration of the vapor chamber 10 may vary according to the specific application for which it is intended to be used. For example, as already discussed above, the thickness of the vapor chamber depends on the nature and size of the personal electronic device 18. The vapor chamber 10 may be non-rectangular, non-planar and/or of non-uniform thickness, at least partly depending on the shape and size of the heat-generating component to be cooled, and/or the size and nature of the personal electronic device 18.

In use, at least one heat-generating component 26 is received on the upper surface 20 of vapor chamber 10, either directly or via a substrate on which the heat-generating component 26 is mounted. Illustrated personal electronic device 18 has one such heat-generating component 26. The heat-generating component 26 may comprise the central processing unit (CPU) of the electronic device 18, the CPU having one or more processors, each processor comprising a computer chip. The electronic device 18 may include one or more processors, and may include other heat-generating components such as a rechargeable lithium-ion battery. In the present embodiment the heat-generating component 26 being cooled by the vapor chamber 10 is a single processor (CPU) comprising a computer chip, and therefore the heat-generating component 26 is referred to in the following description as "computer chip 26". The computer chip 26 is shown in FIG. 1 as a flat rectangular prism having a surface area from about 100-225 mm$^2$, i.e. having dimensions of about 10×10 mm$^2$ to 15×15 mm$^2$, which is directly received on the upper surface 20 of vapor chamber 10. The local area of the vapor chamber 10 on which the computer chip 26 is received is shown by dotted lines in FIG. 2.

The first plate 12 has an inner face 28 which faces toward the interior of the vapor chamber 10, and an outer face 30 which defines either the upper or lower surface 20, 22 of the vapor chamber 10. An outer peripheral edge of the first plate 12 is provided with a peripheral sealing surface 32 which is formed on a raised peripheral flange 33, wherein the peripheral sealing surface 32 is flat and planar and flange 33 is elevated relative to other areas of the inner face 28, wherein the height of the flange 33 is substantially the same as the height of the fluid chamber 34, such that the area of inner face 28 which is surrounded by sealing flange 32 partly defines a fluid chamber 34 enclosed between the first and second plates 12, 14. While this description is applicable to the present embodiment, it will be appreciated that the height of the fluid chamber 34 may not necessarily be the same as the height of the flange 33. For example, this may not be the case where the first plate 12 is non-planar or of non-uniform height.

Figure 2:
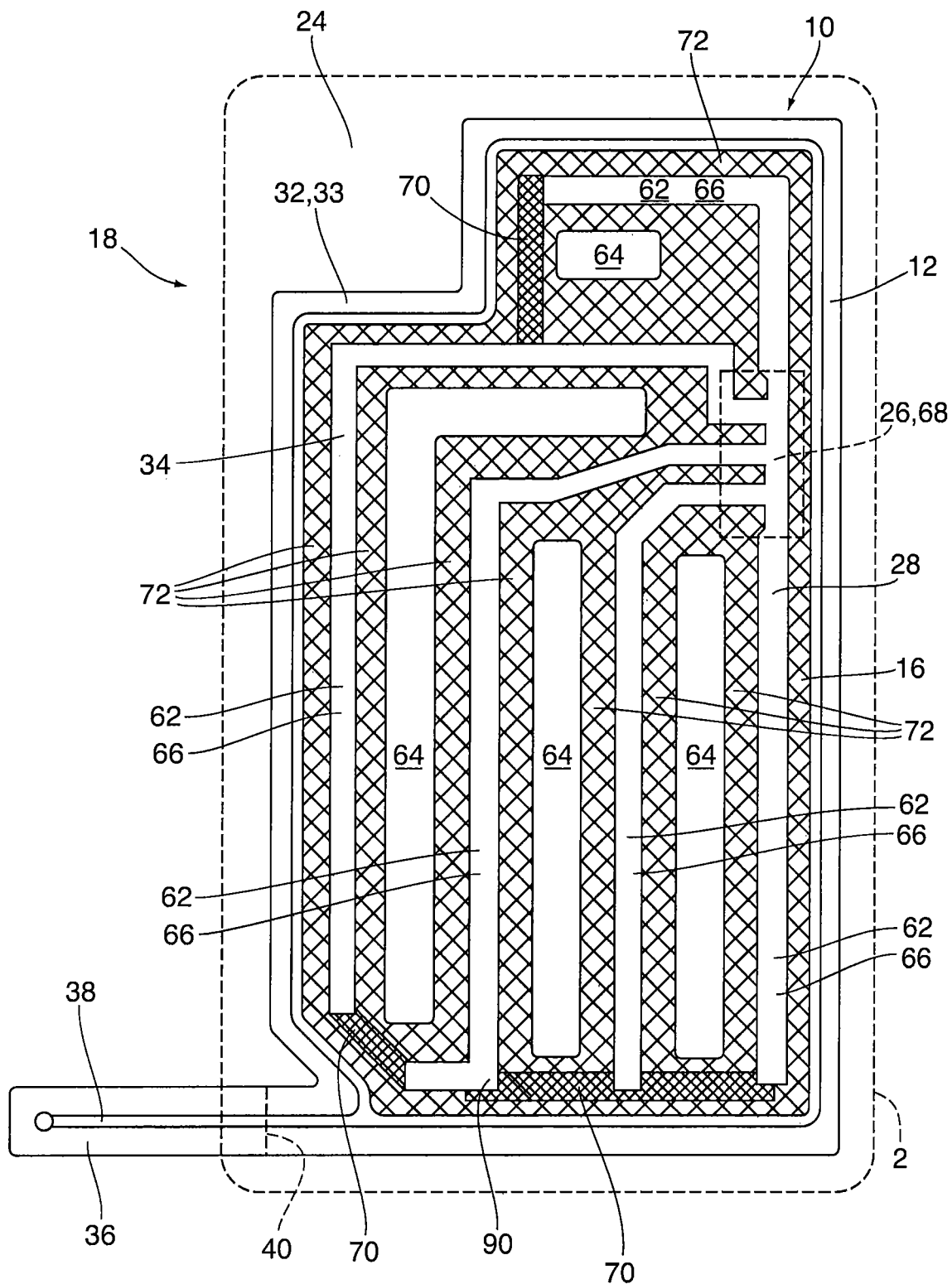
FIG. 2 is a plan view showing the interior of the heat exchanger of FIG. 1, with the second plate removed.
Figure 3:
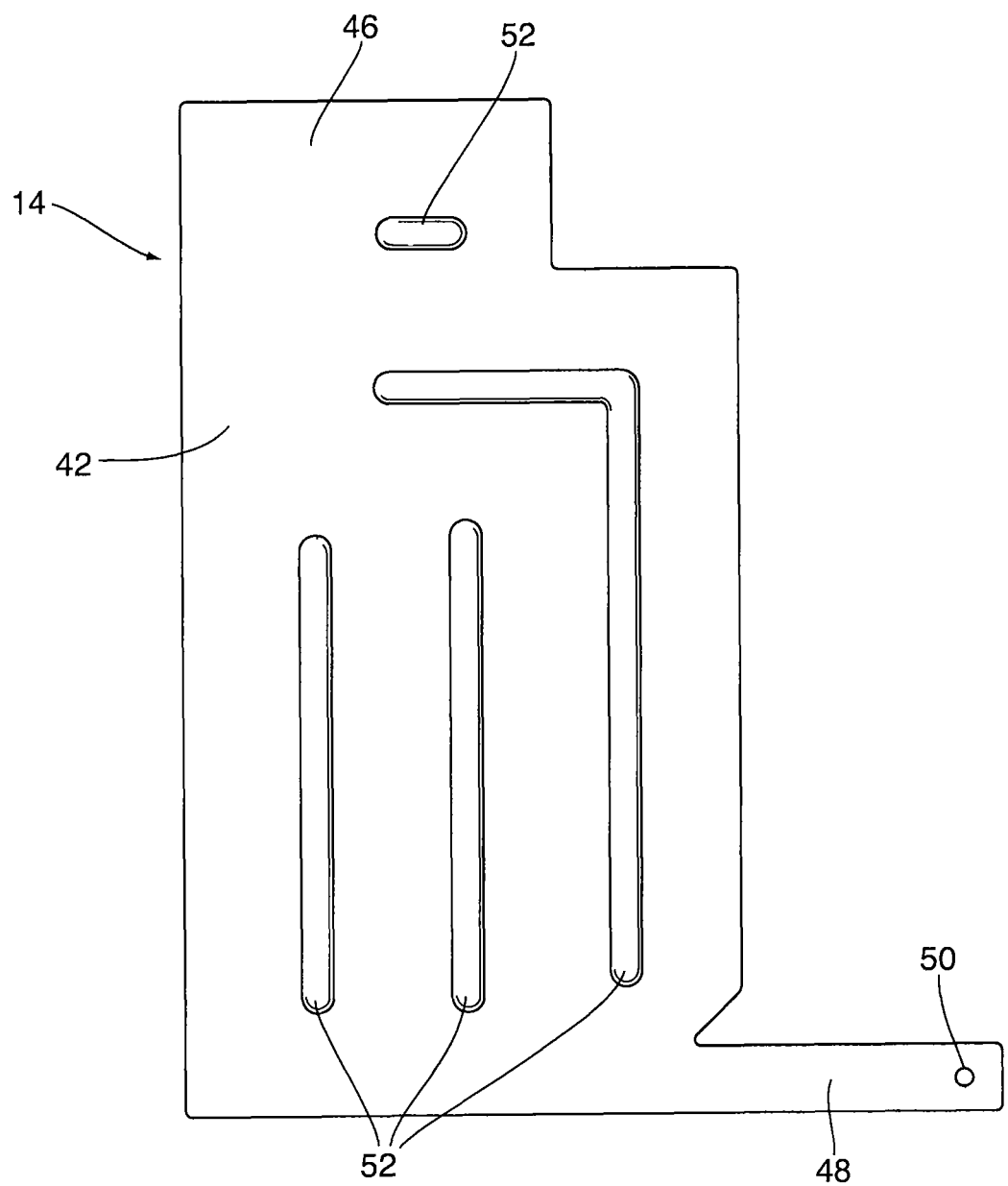
FIG. 3 is a plan view of the second plate of the heat exchanger of FIG. 1.

As shown in FIG. 2 the first plate 12 includes an extension portion 36 into which the sealing flange 32 extends, and which partly defines a fluid filling channel 38 in fluid flow communication with the fluid chamber 34. The fluid filling channel 38 extends outside the outline of the personal electronic device 18 and is present only for the purpose of filling the working fluid into the fluid chamber 34 during manufacturing. Once the fluid chamber 34 is filled, the extension portion 36 is cut off along seal line 40 with the fluid chamber 34 being sealed to prevent escape of the working fluid from the fluid chamber 34. The seal line 40 is indicated by a dotted line in FIG. 2. The working fluid is typically water.

The second plate 14 may have the same size and shape as the first plate 12, having an inner face 42 which faces toward the interior of the vapor chamber 10, and an outer face 44 which defines either the upper or lower surface 20, 22 of the vapor chamber 10. An outer peripheral edge of the first plate 12 is flat and planar to provide a peripheral sealing surface 46 on the inner face 42 which is adapted to be sealed to the sealing surface 32 of first plate 12. In the present embodiment, the peripheral sealing surface 46 is co-planar with the remainder of the inner face 42, except as noted below, wherein the areas of inner face 42 which are surrounded by sealing surface 46 partly define the fluid chamber 34.

Some of the drawings show that the computer chip 26 is received on the outer face 30 of the first plate 12, which therefore defines the upper surface 20 of the vapor chamber 10. However, since both plates 12, 14 in the present embodiment are generally flat and planar, the computer chip 26 may instead be received on the outer face 44 of the second plate 14, either directly or via a substrate on which it is mounted, in which case the outer face 44 of the second plate 14 will define the upper surface 20 of the vapor chamber 10 on which the chip 26 is supported.

The embodiment described herein includes one predominantly planar plate 14 which is bonded to a plate 12 having a raised peripheral sealing flange 33. This arrangement is not essential. Instead of the arrangement shown herein, it will be appreciated that both the first and second plates 12, 14 could both be formed with raised peripheral sealing flanges 33 which are mirror images of one another, with the combined heights of the flanges 33 of the first and second plates 12, 14 being substantially the same as the height of the fluid chamber 34.

The second plate 14 includes an extension portion 48 having the same outer dimensions as the extension portion 36 of first plate 12. The extension portion 48 of second plate 14 may be flat and is adapted to seal to the extension portion 36 of first plate 12, and partly defines the fluid filling channel 38. The extension portion 48 of second plate 14 has a hole 50 through which the fluid is injected into channel 38, the hole 50 being aligned with the end of the fluid filling channel 38, which may optionally have an enlarged bulbous form.

The vapor chamber 10 may optionally be provided with a plurality of reinforcing ribs 52 to enhance its structural rigidity, to provide structural support for the fluid chamber 34, and optionally to help guide fluid flow within the fluid chamber 34. The reinforcing ribs 52 are spaced apart across the area of the vapor chamber 10. In the present embodiment, the vapor chamber 10 includes a plurality of reinforcing ribs 52 extending parallel to its longer sides (referred to herein as longitudinal ribs), and a plurality of reinforcing ribs 52 extending parallel to its shorter sides (referred to herein as transverse ribs). The reinforcing ribs 52 may vary in length and in number, depending on the specific configuration of vapor chamber 10. It will be appreciated that the peripheral sealing flange 33 also enhances the rigidity of the vapor chamber 10. It may be possible to reduce or eliminate the need for reinforcing ribs 52 where the rigidity of the metal comprising the first and second plates 12, 14 is sufficient to meet strength requirements.

In the present embodiment the reinforcing ribs 52 extend upwardly into the fluid chamber 34 from the inner face 42 of second plate 14, having a height relative to inner face 42 which is substantially the same as the height of peripheral sealing flange 33 and sealing surface 32 relative to the inner face 28 of the first plate 12, and substantially the same as the height of the fluid chamber 34. Each reinforcing rib 52 has a top sealing surface 54 which may be flat and planar, along which the reinforcing rib 52 is joined to the inner face 28 of the first plate 12.

In alternate embodiments at least some of the reinforcing ribs 52 may instead be provided on the first plate 12, or both plates 12, 14 may be provided with mirror image reinforcing ribs 52 which are attached to each other.

The first and second plates 12, 14 are comprised of a relatively rigid heat-conducting material. In an embodiment, the first and second plates 12, 14 are comprised of stainless steel at least partly due to its rigidity, which is greater than that of conventional materials such as copper. The use of a more rigid material such as stainless steel means that the first and second plates 12, 14 may comprise thinner gauge material than copper plates of comparable rigidity, thereby reducing weight, cost and thickness. Also, the use of a more rigid metal such as stainless steel may reduce or eliminate the need for reinforcing ribs 52 in some applications.

Typically the first and second plates 12, 14 each comprise a core layer 56 of stainless steel, and a continuous inner clad layer 58 of another metal along its inner face 28, 42. The metal of the inner clad layer 58 comprises a metal having a melting temperature lower than the melting temperature of the stainless steel core layer 56, and which is inert to the working fluid. For example, the inner clad layer 58 may comprise copper or nickel. The inner clad layer 58 is typically very thin, being about 2-10 percent by thickness, typically about 3-4 percent by thickness, of each of the first and second plates 12, 14. For example, the thickness of each clad layer may be on the order of about 1-10 microns.

Each of the first and second plates 12, 14 may further comprise a continuous outer clad layer 60 along its outer face 30, 44 differing in composition from the core layer 56, and optionally differing in composition from the inner clad layer 58. The outer clad layer 60 may be selected for a desirable property such as corrosion resistance, and may comprise copper or nickel. The outer clad layer 60 may have the same or similar thickness as the inner clad layer, i.e. about 2-10 percent by thickness, typically about 3-4 percent by thickness, of each of the first and second plates 12, 14.

The wick material 16 is received inside the fluid chamber 34 between the inner face 28 of the first plate 12 and the inner face 42 of the second plate 14. In the present embodiment the wick material 16 may be comprised of at least one layer of a fine mesh of a material which is compatible with the working fluid. For example, in the embodiments described herein, the mesh may be comprised of metal wire, wherein the metal comprising the mesh is inert to the working fluid, and may be copper or nickel. In the present embodiment, the wick material 16 comprises a single layer of a metal wire mesh material in the form of a sheet. In the present embodiment, the wick material 16 may have a thickness of about 100-300 micrometers, and is desirably as thin as possible so as to minimize the thickness of the vapor chamber 10. In at least some areas of the wick material 16, the wick material 16 may be in contact with the inner surfaces 28, 42 of the first and second plates 12, 14, as further discussed below.

The wick material 16 is hydrophilic, with the wire mesh containing a large number of small voids within which capillary forces are generated to cause circulation of the working fluid through the wick material 16.

The wick material 16 is formed with a first plurality of cutouts 62 which define a plurality of primary gas flow passages 66 for circulation of the gaseous working fluid which is generated by vaporizing the working fluid with heat produced by the computer chip 26. Where reinforcing ribs 52 are provided, the wick material 16 also has a second plurality of cutouts 64 which define spaces in which the reinforcing ribs 52 are provided and can traverse the height of the fluid chamber 34. It will be appreciated that the ribs 52 and cutouts 64 may serve a locating function to ensure that the wick material 16 is properly located and oriented inbetween plates 12, 14. This function may be of particular importance where the wick material 16 comprises a plurality of strips.

The primary gas flow passages 66 are spaced apart across the area of the vapor chamber 10 and are configured to allow the gaseous working fluid to flow from away from the computer chip 26 toward the outer periphery of the vapor chamber 10, to effectively distribute and dissipate the heat generated by the computer chip 26 throughout the surface area of device 18. It can be seen that the plurality of primary gas flow passages 66 provided within the fluid chamber 34 either traverse or terminate within the area 68 of the vapor chamber 10 (indicated by dotted lines in FIG. 2) on which the computer chip 26 is supported and which directly receives heat energy from chip 26 by conduction through first plate 12, referred to herein as the "evaporation zone 68". This permits the vaporized working fluid to flow outwardly away from the evaporation zone 68 toward cooler areas of the vapor chamber 10.

In the present example, vapor chamber 10 includes five primary gas flow passages 66, each of which terminates at the evaporation zone 68 and has an open first end which is in open flow communication with the evaporation zone 68 and with the open first ends of the other primary gas flow passages 66.

In addition to cutouts 62, 64, the wick material 16 includes a hydrophilic portion in which the wick material 16 is substantially uncompressed, such that it has the mesh structure mentioned above, with a large number of small voids within which capillary forces are generated to cause circulation of liquefied working fluid. The hydrophilic portion is illustrated in FIG. 2 as the area of wick material 16 with large cross-hatching. The hydrophilic portion defines a plurality of liquid flow passages 72 which are spaced apart across the area of the vapor chamber 10 and which either traverse or terminate within the evaporation zone 68. These liquid flow passages 72 deliver the condensed working fluid to the evaporation zone 68 from other areas of the vapor chamber 10.

In the hydrophilic portion defining the liquid flow passages 72, the wick material 16 may extend throughout the full height of the fluid chamber 34, and may be in contact with the inner face 28 of first plate 12 and the inner face 42 of second plate 14 along the top and bottom surfaces of the hydrophilic portion. Contact between wick material 16 and the inner surfaces 28, 42 of plates 12, 14 is beneficial in that it permits capillary flow in the voids which exist at the interfaces between wick material 16 and plates 12, 14. In addition, at least in the evaporation zone 68, there may be significant conduction of heat from chip 26 through the first plate 12 into the wick material 16, the conduction being enhanced by contact between the wick material 16 and the inner face 28 of first plate 12.

In addition to cutout areas 62, 64 and the hydrophilic portion comprising the liquid flow passages 72, the wick material 16 may include one or more non-wicking areas in which there is little or no circulation of liquefied working fluid by capillary forces, and in which the flow of gaseous working fluid is permitted. These non-wicking areas are illustrated in FIG. 2 as the portions of wick material 16 with dense cross-hatching. In the present embodiment, the non-wicking areas comprise areas in which the wick material 16 is reduced in thickness relative to the hydrophilic portion, for example by flattening, so as to form one or more secondary gas flow passages 70. Each of the secondary gas flow passages 70 interconnects two or more primary gas flow passages 66, thereby providing improved flow distribution of the gaseous working fluid across the surface area of vapor chamber 10.

With the configuration of the vapor chamber 10 shown in the drawings, it can be seen that gaseous working fluid generated in the evaporation zone 68 will flow away from the evaporation zone 68 through the primary and secondary gas flow passages 66, 70 toward the outer edges of the vapor chamber 10. As the gaseous working fluid flows away from the computer chip 26 into cooler areas of the vapor chamber 10, its temperature drops. Once the temperature of the working fluid falls to the condensation temperature, the gaseous working fluid condenses to the liquid state, releasing the heat of condensation across the surface of the vapor chamber 10. The condensed liquid working fluid in the gas flow passages 66, 70 is drawn into the hydrophilic wick material 16 and circulates through the wick material 16 back toward the evaporation zone 68 through the liquid flow passages 72.

Due to the elongate shape of the personal electronic device 18 and the location of computer chip 26 near one end, the gas flow passages 66, 70 and the liquid flow passages 72 extend primarily in a direction which is parallel to the long sides of the vapor chamber 10, i.e. the longitudinal direction. However, some portions of the gas flow passages 66, 70 and the liquid flow passages 72 extend transversely to the long sides of vapor chamber 10 in order to distribute the gas flow and liquid flow across the width of the vapor chamber 10. For example, a pair of transverse secondary gas flow passages 70 are provided near the end of the vapor chamber 10 remote from the evaporation zone 68. In combination with portions of one or more cutouts 62 forming primary gas flow passages 66, these transverse secondary gas flow passages 70 connect the ends of the primary gas flow passages 66 extending longitudinally through the vapor chamber 10, in order to provide uniform fluid distribution and heat distribution throughout the entire surface area of the vapor chamber 10, effectively forming a transverse gas distribution zone 90 extending transversely across the vapor chamber 10 proximate to the end of vapor chamber 10 which is distal to the evaporation zone 68. It will be appreciated that the patterns of gas flow passages 66, 70 and liquid flow passages 72 is dependent on the shape of the device 18 and the specific location of the chip 26 within the device 18, and is therefore variable.

In the illustrated embodiment the wick material 16 comprises a sheet of metal mesh material in which cutouts 62, 64 may be formed by stamping the sheet with a die, and in which the non-wicking areas comprising secondary gas flow passages 70 may be formed by deforming (i.e. flattening) the metal mesh material by compression.

It will be appreciated that one or more of the non-wicking areas comprising secondary gas flow passages 70 could simply be formed by cutouts rather than flattened areas. In such embodiments, at least some of the areas of dense cross-hatching in FIG. 2 would comprise empty areas in which the metal mesh material is removed, as in cutouts 62, 64. Although such embodiments are within the scope of the present disclosure, providing one or more of the secondary gas flow passages 70 in the form of cutouts would result in the separation of the wick material 16 into a plurality of strips. This may complicate the manufacturing process since the plurality of strips would need to be properly located and arranged between plates 12, 14, and would need to be held in place during manufacturing. Furthermore, because the wick material 16 is not bonded to the inner faces 28, 42 of plates 12, 14, at least where the plates 12, 14 are joined by laser welding (further discussed below), it is possible that the strips of metal mesh material, or portions thereof, may shift within chamber 34 during use of the vapor chamber 10, possibly resulting in non-ideal gas or liquid flow patterns, and negatively impacting the effectiveness of vapor chamber 10.

Figure 4:
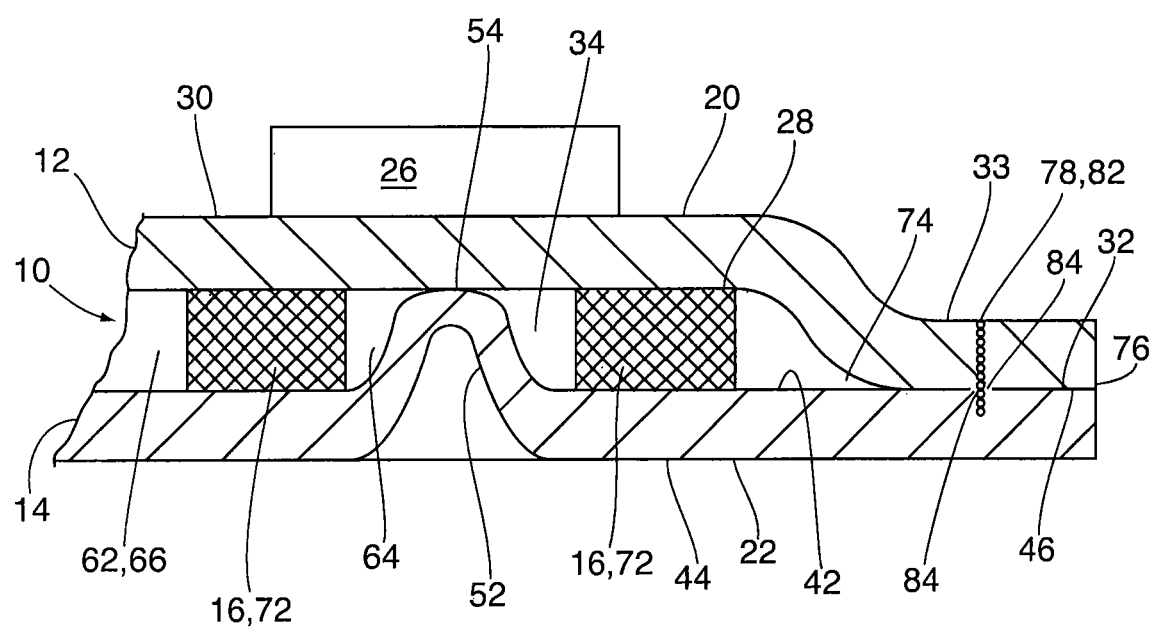
FIG. 4 is a cross-section along line 4-4' of FIG. 1.

On the other hand, forming non-wicking areas by local deformation of the metal mesh material allows the wick material 16 to be provided in the form of a sheet which simply fits inside the raised peripheral flange 33. It can be seen that providing the wick material 16 as a single sheet simplifies placement and proper location of wick material 16 between the plates 12, 14 during manufacturing. It will be appreciated that the wick material 16 may comprise a single layer of mesh material, as shown in FIG. 4, or it may comprise multiple layers of mesh material. The metal mesh of wick material 16 may comprise copper.

At least partly due to the location of the chip 26 and the overall shape of the vapor chamber 10, the primary gas flow passages 66 may have different lengths and widths. The primary gas flow passages 66 may also have different overall shapes, wherein one or more of the primary gas flow passages 66 may be straight and one or more of the primary gas flow passages 66 may others have one or more angular or curved bends. In embodiments where each primary gas flow passage 66 has only one open end (i.e. the first open end) at which they communicate with one another, for example in evaporation zone 68, the amounts of gas flowing into the primary gas flow passages 66 will be different due to the different lengths, widths and dimensions of the primary gas flow passages 66. In other words, the amount of gas that enters each primary gas flow passage 66 will be gauged in accordance with the pressure drop specific to that passage. Having differences in pressure drop and fluid flow in different areas of the vapor chamber 10 can lead to decreased efficiency and decreased temperature uniformity across the surface of the vapor chamber 10.

In the secondary gas flow channels 70 the wick material is reduced in height relative to the liquid flow passages 72, such that it occupies only a portion of the height of fluid chamber 34, thereby permitting gas to flow over and/or under it. Reducing the height of the wick material 16 by compression also decreases its porosity, which will prevent or reduce its ability to wick the condensed working fluid. For example, the wick material 16 may be about 30-60% porous in the hydrophilic portion comprising liquid flow passages 72, and may be a solid, essentially non-porous mass having a fraction of the uncompressed thickness of the wick material in the non-wicking areas comprising the secondary gas flow passages 70.

The secondary gas flow passages 70 connect each of the primary gas flow passages 66 to one or more other primary gas flow passages 66, such that all the primary gas flow passages 66 are interconnected at areas which are distal from the evaporation zone 68. For example, in vapor chamber 10, each of the primary gas flow passages 66 has first and second opposed ends, wherein the first end is located in the evaporation zone 68 where it is in open flow communication with the first ends of the other primary gas flow passages 66. In effect, the evaporation zone 68 functions as a gas inlet manifold to distribute gas flow to the first ends of all the primary gas flow passages 66. For this reason, the evaporation zone 68 is also sometimes referred to herein as the "gas inlet manifold area" or the "first manifold area".

The second end of each primary gas flow passage 66 of vapor chamber 10 is in open flow communication with at least one other primary gas flow passage 66 through one of the secondary gas flow passages 70. Therefore, the secondary gas flow passage(s) 70 together function somewhat as a gas outlet manifold to collect gas flow from the second ends of the primary gas flow passages 66 and distribute it across the vapor chamber 10, to balance flow and pressure drop of the gas flow discharged from the primary gas flow passages 66. For this reason, the area(s) occupied by secondary gas flow passage(s) 70 is/are sometimes referred to herein as the "gas outlet manifold area(s)" or the "second manifold area(s)".

Therefore, with the provision of secondary gas flow passages 70, the primary gas flow passages 66 are open at their first and second open ends to the first and second manifold areas.

The liquid flow passages 72 similarly have first and second ends, with the first end of each liquid flow passage 72 being located in the evaporation zone 68. In the present embodiment, the first ends of at least some of the liquid flow passages 72 may be combined together within or adjacent to the evaporation zone 68. Therefore, the first manifold area (evaporation zone 68) may also be considered a liquid outlet manifold area into which liquid is discharged from the first ends of liquid flow passages 72.

The second end of each liquid flow passage 72 is in open flow communication with at least one of the liquid flow passages 66 and/or at least one of the secondary gas flow passages 70. Because the secondary gas flow passages 70 distribute the flow of the working fluid as it condenses from gas to liquid form, the secondary gas flow passage(s) 70 collectively function as a liquid inlet manifold to distribute the condensed working fluid to the second ends of the liquid flow passages 72. Therefore, the second manifold area(s) comprising secondary gas flow passage(s) 70 may be considered a liquid inlet manifold.

Thus, the provision of secondary gas flow channels 70 communicating with the second ends of the primary gas flow passages 66 and the liquid flow passages 72 balances the gas and liquid flow across the vapor chamber, and also balances the pressure drop. This will reduce the overall pressure drop and allow for more effective use of the entire area of the vapor chamber 10, providing better efficiency and temperature uniformity. Furthermore, in a system having two or more heat-generating components, the provision of secondary gas flow channels 70 will help balance the flow in the gas flow passages 66 and liquid flow passages 72 independent of the heat loads of each of the evaporation zones 68.

Instead of comprising wick material 16, it will be appreciated that the first and second plates 12, 14 may include a plurality of hydrophilic and hydrophobic areas, as described in above-mentioned Publication No. US 2016/0290739 A1 by Mochizuki et al.

As mentioned above, the process for manufacturing conventional vapor chambers typically comprises a diffusion bonding process for joining the first and second plates. However, diffusion bonding of vapor chambers is relatively time-consuming and expensive for high-volume manufacturing. To address this issue, the first and second plates 12, 14 of the vapor chamber 10 may be sealingly joined together by laser beam welding (LBW), a welding technique in which the first and second plates 12, 14 are joined together through use of a laser. LBW provides a concentrated heat source, allowing for narrow welds and high welding rates, and is therefore particularly well suited for commercial production of vapor chamber 10.

LBW has high power density (up to about 3 MW/cm2, typically greater than about 0.7 $MW/cm^2$), resulting in small heat-affected zones, high heating and cooling rates, and making LBW suitable for high volume applications. The spot size or beam width of the laser is small (for example about 20-80 microns), to produce a narrow weld joint, and the power, speed and length of the pulses can be varied to weld materials of different thicknesses, with lower powers and higher speeds used to weld thin materials. Weld speeds may range from 100 to 1,000 mm/sec, and therefore a vapor chamber having 700 mm of total weld length can be welded in less than 2 seconds.

LBW is also a versatile process, capable of welding a variety of metals, including clad or unclad stainless steel.

Figure 5:
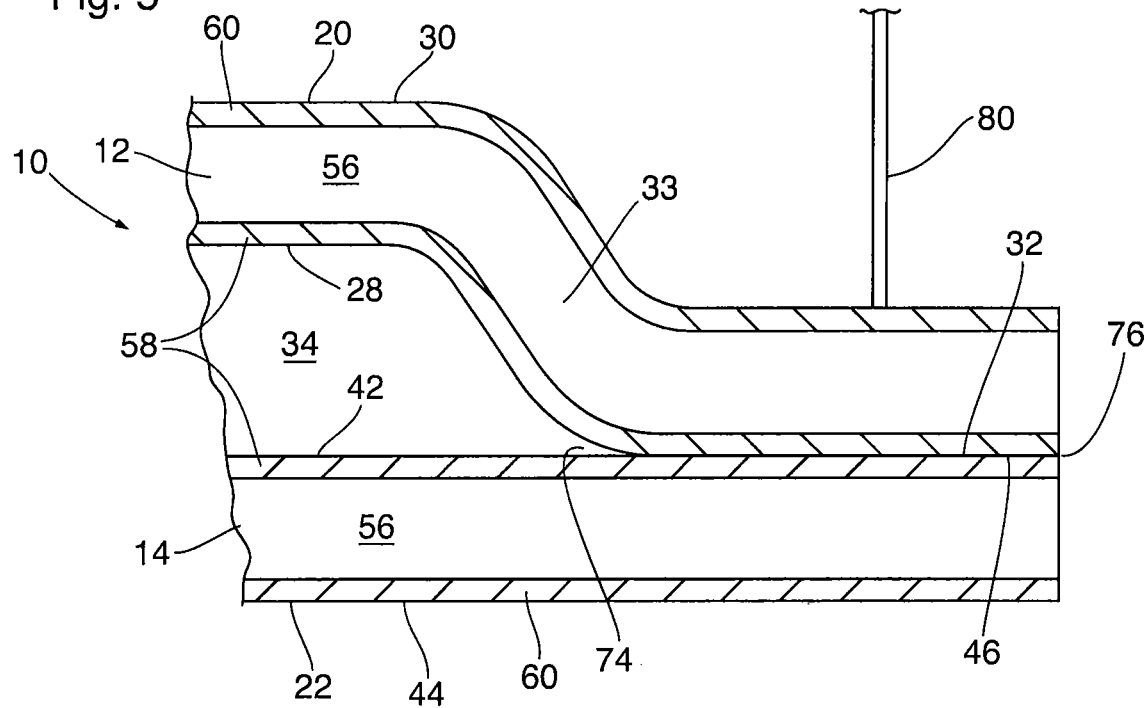
FIG. 5 is an enlarged cross-section along an edge of the heat exchanger of FIG. 1, prior to welding.

FIG. 5 is an enlarged view of the edge of an assembly comprising the first plate 12, second plate 14 and wick material 16, before the plates 12, 14 are joined together by welding. As shown, the plates 12, 14 are positioned with their inner faces 28, 42 facing toward one another, and with the peripheral sealing surface 32 of the first plate 12 in direct contact with the peripheral sealing surface 46 of the second plate 14.

In the present embodiment, each of the first and second plates 12, 14 includes a core layer 56 comprised of stainless steel, and an inner clad layer 58 comprising copper or nickel. Each of the first and second plates may also comprise an outer clad layer 60 which may also comprise copper or nickel. The assembly shown in FIG. 5 may initially be held together by a jig or fixture.

During laser beam welding, a narrow laser beam 80 is directed at a spot which is located between the outer peripheral edge 76 of the plate assembly (defined as the outer peripheral edge of at least one of the mated sealing surfaces 32, 46 of plates 12, 14) and the outer peripheral edge 74 of the fluid chamber 34. FIG. 5 shows the laser beam 80 being directed at an area which is approximately midway between the outer peripheral edge 76 of the plate assembly and the outer peripheral edge 74 of the fluid chamber 34. However, it will be appreciated that this is not essential in all embodiments, and that the laser beam 80 may instead be directed at an area which is very close to the outer peripheral edge 76 of the plate assembly.

The laser beam welding parameters are selected so that the laser beam 80 locally heats the plates 12, 14 to produce a narrow fusion zone 78 in the area where it strikes the plates 12, 14, the fusion zone 78 extending through one of the plates 12, 14 and at least partially through the adjoining plate 12, 14. Optionally the fusion zone 78 may extend through the combined thickness of the first and second plates 12, 14.

Within the fusion zone 78 the first and second plates 12, 14 are rapidly heated to their melting temperature, causing the metal of plates 12, 14 within the fusion zone 78 to melt and fuse together. Upon cooling, the molten metal within the fusion zone 78 solidifies to form a weld joint or weld nugget 82 at which the plates 12, 14 are sealed together. This weld joint 82 comprises an alloy of the core layer 56 and clad layers 58, 60 and sealingly joins the first and second plates 12, 14 together along the entire outer peripheral edge 76 of the plate assembly. In the illustrated embodiment, the fusion zone 78 and resulting weld joint 82 extend through the core layer 56 and clad layers 58, 60 of the first plate 12, through the inner clad layer 58 of second plate 14, and partially through the thickness of the core layer 56 of the second plate 14.

During welding, the heat of the laser beam 80 is conducted outwardly, through the plates 12, 14, beyond the fusion zone 78 and into adjacent areas of the plates 12, 14. The welding parameters are selected so that the laser beam 80 does not heat these areas to sufficiently high temperatures to melt the core layer 56 of the first and second plates 12, 14 within these areas. However, due to their lower melting temperature, the inner clad layers 58 of the two plates 12, 14 are at least partially melted and fused together within narrow areas located immediately adjacent to the weld joint 82, these narrow areas being defined herein as the heat-affected zone 84.

The melting and fusion of the lower-melting inner clad layers 58 of the first and second plates 12, 14 in the heat-affected zone 84 is similar to the formation of a braze joint between two braze sheets comprising a higher melting core layer clad with a lower-melting brazing alloy which forms a filler metal when heated to its melting temperature. Within the heat-affected zone 84, the inner clad layers 58 of the first and second plates 12, 14 similarly form a filler metal which forms a continuous seal between the plates 12, 14, on both sides of the weld joint, and which may flow by capillary forces through at least a portion of the area in which the peripheral sealing surface 32 of the first plate 12 is in contact with the peripheral sealing surface 46 of the second plate 14.

Figure 6:
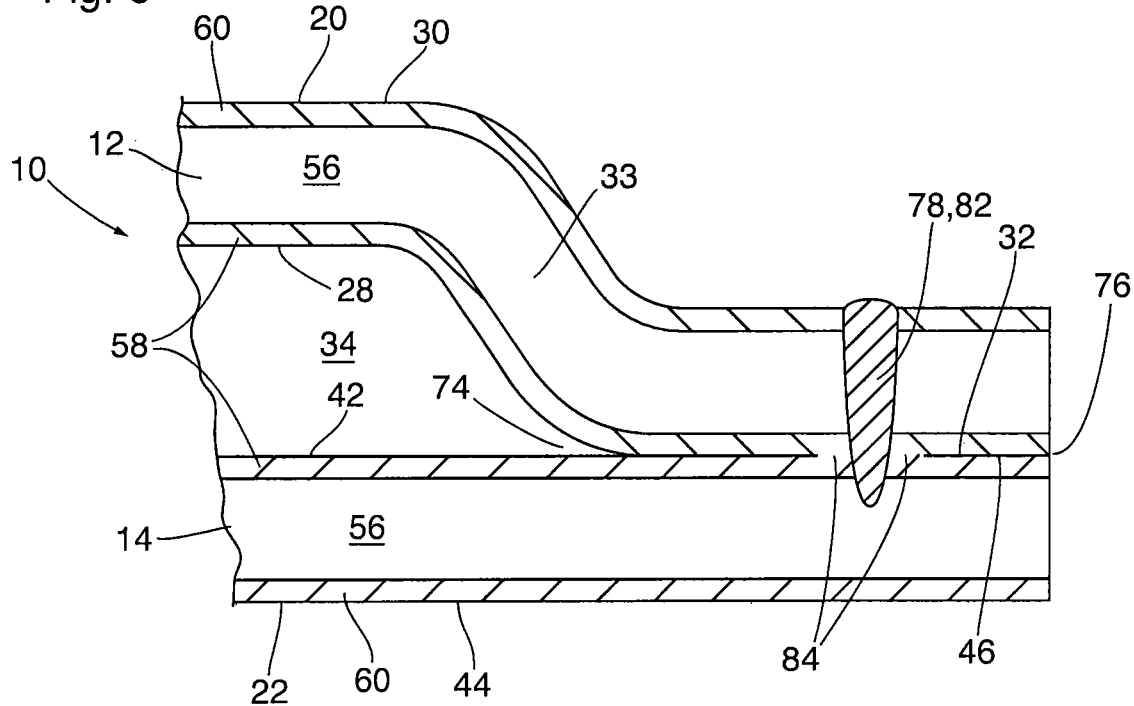
FIG. 6 is an enlarged cross-section similar to FIG. 5, after welding.

For example, as shown in FIG. 6, the power of the laser beam 80 is selected so that the heat affected zone 84 is relatively narrow and does not extend outwardly to the peripheral edge 74 of chamber 34 and/or the outer peripheral edge 76 of sealing surfaces 32, 46, so as to avoid melting and disrupting the clad layer 58 in areas which will be in contact with the working fluid, i.e. the inner surfaces of the liquid chamber 34.

As can be seen from FIG. 6, the weld joint 82 is isolated from contact by the heat affected zone 84 in which the inner clad layers 58 of the first and second plates 12, 14 are fused together. Thus, all the inner surfaces of the liquid chamber 34 are comprised of the metal of the inner clad layer 58, which is inert to the working fluid. For example, where the working fluid is water, and the surfaces of chamber 34 are comprised only of copper or nickel, the working fluid will not react with the walls of the chamber to produce impurities or other undesirable species in the chamber which may affect the operation of the vapor chamber.

One such undesirable species is iron oxide, i.e. rust, which may result from direct contact between the working fluid (e.g. water) with the metal alloy comprising the weld joint, which is predominantly comprised of iron. Oxidation of the iron alloy will result in the formation of non-condensable species in the working fluid, causing a change in the vapor pressure inside the vapor chamber 10, and therefore a reduction of performance.

The application of laser beam welding according to the present embodiment not only provides for fast joining of the plates 12, 14, but also avoids the above problem of forming a weld joint 82 which is fluidly isolated from the working fluid around the peripheral edge of chamber 34 by a layer of fused cladding material 58 which is inert to the working fluid.

The parameters of the welding operation are controllable to achieve a weld joint having the above features. These parameters affecting the quality of the weld joint include the power of the laser beam 80, the width of the beam 80, the length of the pulses, the type and thickness of the cladding layer 58, the width of the sealing surface 32 and sealing surface 46, the distance from the weld joint 82 to the outer peripheral edge of the fluid chamber 34, the fixture contact pressure applied to the sealing surfaces 32, 46 of plates 12, 14 during welding, cleanliness, and welding speed.

The sealing surfaces 54 of the reinforcing ribs 52 optionally provided in the second plate 14 are laser beam welded in the same manner to the inner face 28 of the first plate 12, such that a weld joint 82 formed along the sealing surface 54 is isolated from the working fluid around the peripheral edges of the reinforcing ribs 52 by a layer of fused cladding material 58 in a heat-affected zone 82, the layer of fused cladding material 58 being inert to the working fluid.

Samples of vapor chambers 10 prepared according to the process described above have been tested under extreme conditions, without any significant performance degradation, indicating adequate isolation of the weld joints from contact with the working fluid. These tests include temperature cycling tests between 70° C. and −30° C., and long-term heating tests carried out at 125° C.

The vapor chamber 10 is described herein as being flat and planar. It will be appreciated, however, that the vapor chamber 10 may instead be non-planar and/or of variable thickness, depending upon the specific application in which it is used.

Although the heat-generating component described in the above embodiment comprises a single computer chip 26, it will be appreciated that the vapor chamber 10 described herein can be used for cooling a wide variety of heat-generating electronic components, and may be used for cooling more than one heat-generating component in a single personal electronic device 18. For example, the vapor chamber 10 described herein may provide heat dissipation and cooling for batteries of personal electronic devices 18, for which 50° C. is about the maximum temperature that a battery can withstand before swelling occurs. Therefore, the vapor chamber 10 may also be used to provide improved uniformity in battery temperatures of personal electronic devices 18, particularly during fast charging.

It will be appreciated that references to copper and nickel in the present disclosure include pure copper and nickel, and alloys thereof. Also, it will be appreciated that references to copper as a metal included in any components of vapor chamber 10 include oxygen-free copper.

A heat exchanger 100 according to a second embodiment is now described below with reference to FIGS. 7 and 8. Heat exchanger 100 comprises a vapor chamber including a number of elements which are similar or identical to corresponding elements of vapor chamber 10 described above. Like elements of vapor chamber 100 are identified by like reference numerals in FIGS. 7 and 8, and in the following description, and it will be appreciated that the above description of these like elements with reference to vapor chamber 10 applies equally to vapor chamber 100, unless indicated to the contrary.

Figure 7:
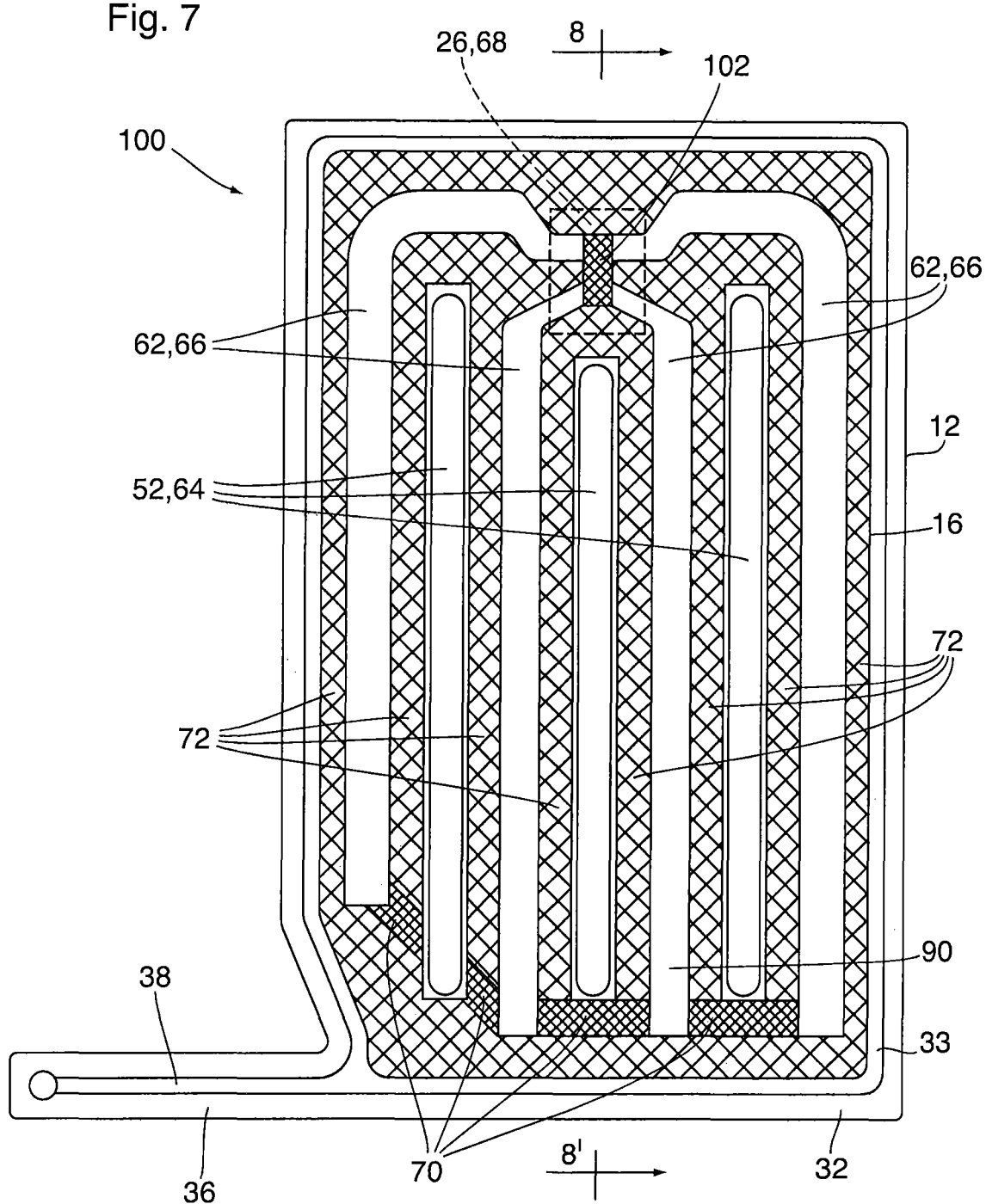
FIG. 7 is a plan view similar to FIG. 2, showing the interior of a heat exchanger according to a second embodiment, with the second plate removed.
Figure 8:
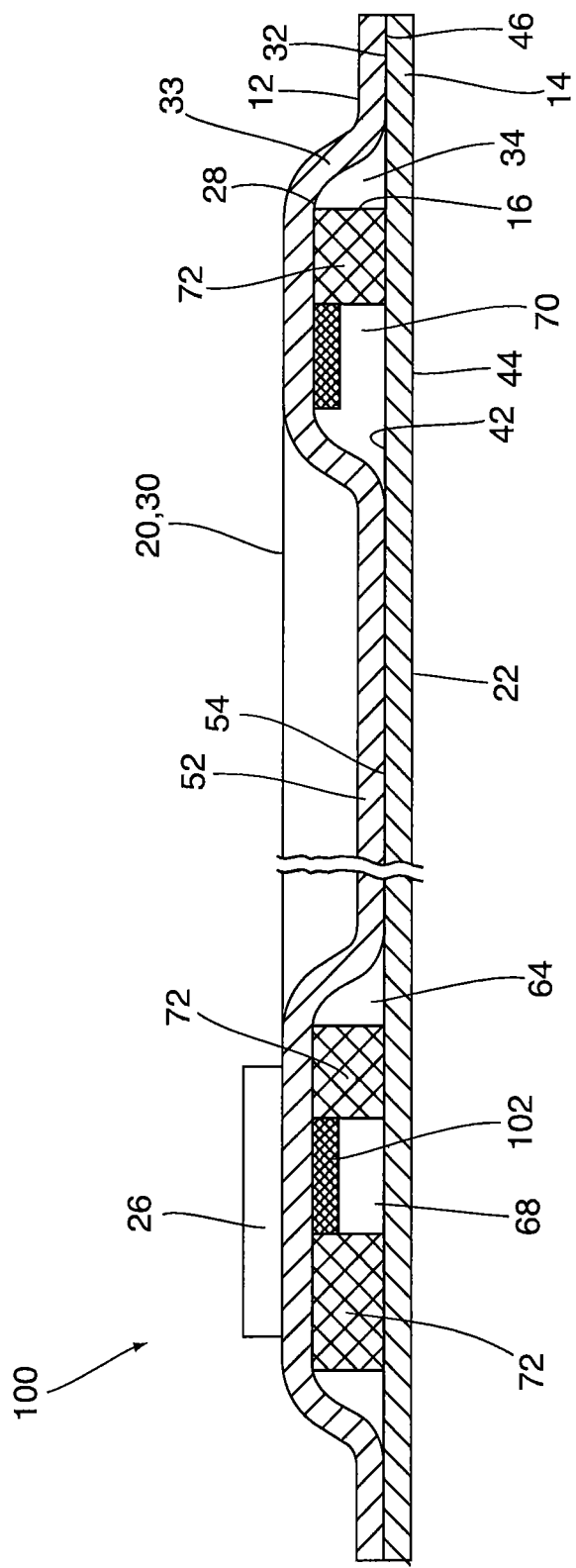
FIG. 8 is a cross-section along line 8-8' of FIG. 7.

FIGS. 7 and 8 illustrate the second plate 14 and the wick material 16 of vapor chamber 100. The second plate 14 of vapor chamber 100 is identical to the second plate 14 of vapor chamber 10, that it includes ribs 52 similar to those of the first plate 12 in vapor chamber 10. In addition, the rib pattern is somewhat difference, with vapor chamber 100 including three straight, parallel ribs 52 which extend longitudinally along the inner face 28 of first plate 12.

Vapor chamber 100 also includes a second plate 14, shown in FIG. 8, which is identical to the second plate 14 of vapor chamber 10 except that it does not have ribs 52.

The wick material 16 of vapor chamber 100 is the same as that of vapor chamber 10, except for the shapes and locations of the first and second cutouts 62, 64 and the shapes and locations of the non-wicking areas comprising the secondary gas flow passages 70. Rather, the cutouts 62, 64 and secondary gas flow passages 70 of vapor chamber 100 are arranged to provide a somewhat different flow pattern than in vapor chamber 10, due to the location of evaporation zone 68 in the approximate center of the vapor chamber 100, rather than close to one of the edges. However, despite the different arrangement of the liquid flow passages 72 and the primary and secondary gas flow passages 66, 70, the above comments relating to the operation of vapor chamber 10 apply equally to vapor chamber 100.

As in vapor chamber 10, vapor chamber 100 includes a transverse gas distribution zone 90 which comprises the secondary gas flow passages 70 proximate to the end of the vapor chamber 100 which is distal from the evaporation zone 68, In addition to having one or more non-wicking areas comprising one or more secondary gas flow passages 70 proximate to the second ends of the primary gas flow passages 66, the vapor chamber 100 includes a non-wicking area in the form of a connecting piece 102 which is at least partially located within the evaporation zone 68, and which is in open flow communication with the first open ends of all the primary gas flow passages 66. The connecting piece 102 may be formed in the same manner as the secondary gas flow passages 70, for example by flattening of the wick material 16.

The connecting piece 102 provides a physical connection between the free ends of the liquid flow passages 72 which converge at or adjacent to the evaporation zone 68. Without connecting piece 102, the converging ends of the liquid flow passages 72 could move relative to one another during manufacturing or during use, similar to the case where the wick material comprises a plurality of strips, as explained previously.

The connecting piece 102 may be formed so that it will be in contact with the inner surface 28 or 42 of the plate 12 or 14 which will be in contact with the heat-generating component 26, so that connecting piece 102 will assist in conducting heat away from heat-generating component 26. For example, as shown in the central longitudinal cross-section of FIG. 8, the connecting piece 102 is in contact with the inner face 28 of the first plate 12, opposite to the heat-generating component 26.

Although connecting piece 102 provides the benefits discussed above, it will be appreciated that the present disclosure includes embodiments in which the connecting piece 102 is eliminated, such that the free ends of the liquid flow passages 72 are disconnected from one another.

Figure 9:
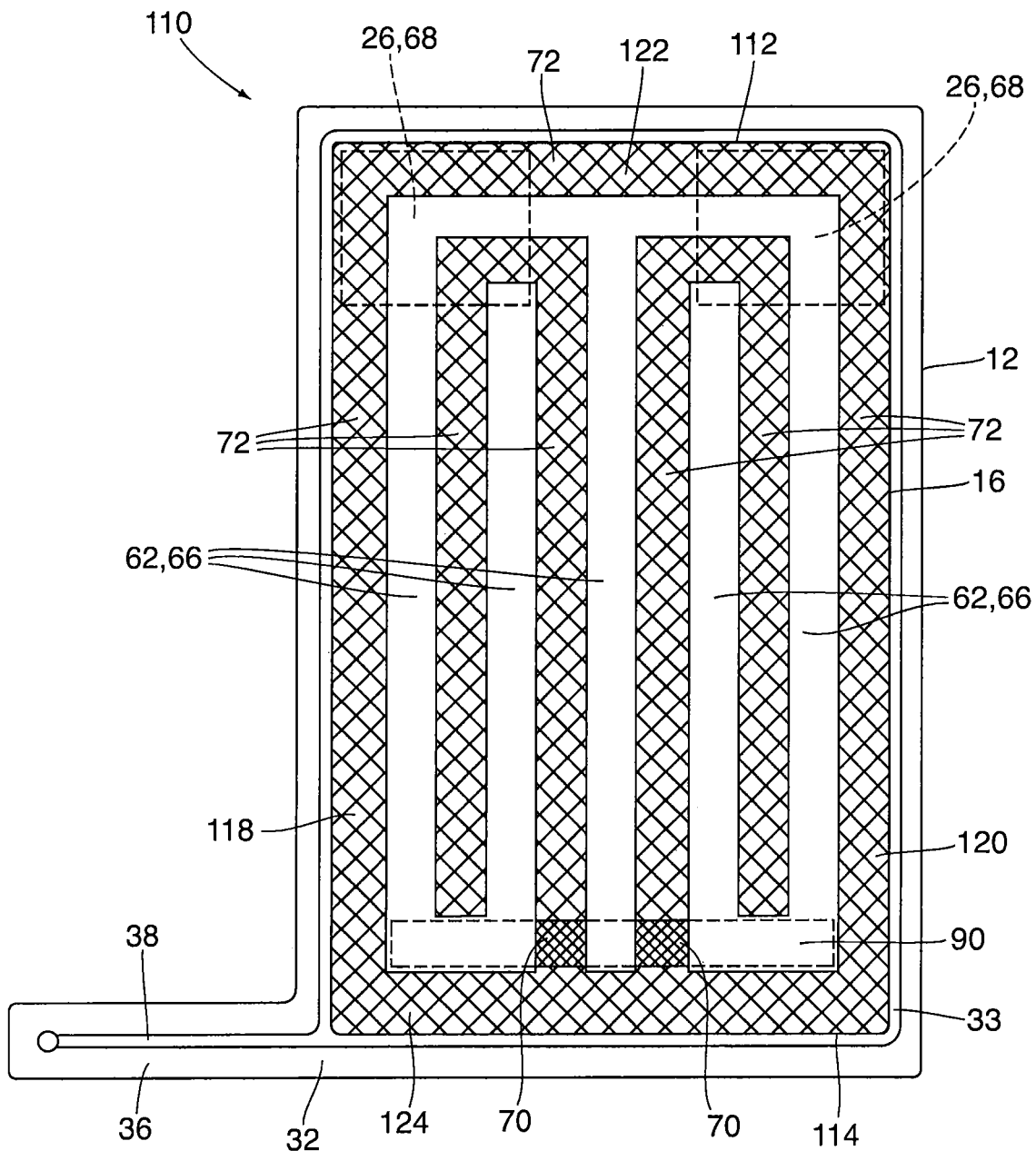
FIG. 9 is a plan view similar to FIG. 2, showing the interior of the heat exchanger according to a third embodiment, with the second plate removed.

FIG. 9 illustrates a heat exchanger 110 according to a third embodiment, comprising a vapor chamber 110 adapted for cooling of multiple heat-generating components. The multiple heat-generating components may be the same or different, and may each comprise a processor (computer chip), rechargeable battery, etc. Like elements of the vapor chamber shown in FIG. 9 are identified with like reference numerals.

Vapor chamber 110 includes two evaporation zones 68 located at two directly opposed corners of the vapor chamber 110 proximate to a first end 112 thereof. The vapor chamber 110 includes a plurality of primary gas flow passages 66 extending parallel to one another along the longitudinal dimension of the vapor chamber 110, each of the primary gas flow passages 66 having an open first end in flow communication with one of the evaporation zones 68, and a second end located proximate to a second end 114 of vapor chamber 110.

The wick material 16 of vapor chamber 110 includes a hydrophilic portion defining a plurality of liquid flow passages 72 extending longitudinally and parallel to one another, each having a first end in flow communication with one of the evaporation zones 68, and a second end proximate to the second end 114 of vapor chamber 110. The hydrophilic portion of wick material 16 includes a continuous perimeter portion 116 comprising two longitudinal side portions 118, 120 and two transverse end portions 122, 124. The second end of each liquid flow passage 72 is spaced from the transverse end portion 118 proximate to the second end 114 of vapor chamber by a transverse gas distribution zone 90 (illustrated in dotted lines in FIG. 9) extending transversely between the side portions 118, 120, and being in open flow communication the second ends of the primary gas flow passages 66. The transverse gas distribution zone 90 includes portions of one or more of the cutout areas 62 forming the primary gas flow passages 66 and/or one or more secondary gas flow passages 70 comprising reduced-height, non-wicking portions of the wick material 16, as defined above. Thus, as in the embodiments described above, the second end of each of the primary gas flow passages 66 is connected to the other primary gas flow passages 66 through the transverse gas distribution zone 90, and the secondary gas flow passages 70 comprised of reduced-height, non-wicking portions permit the use of a single piece of wick material 16.

Figure 11:
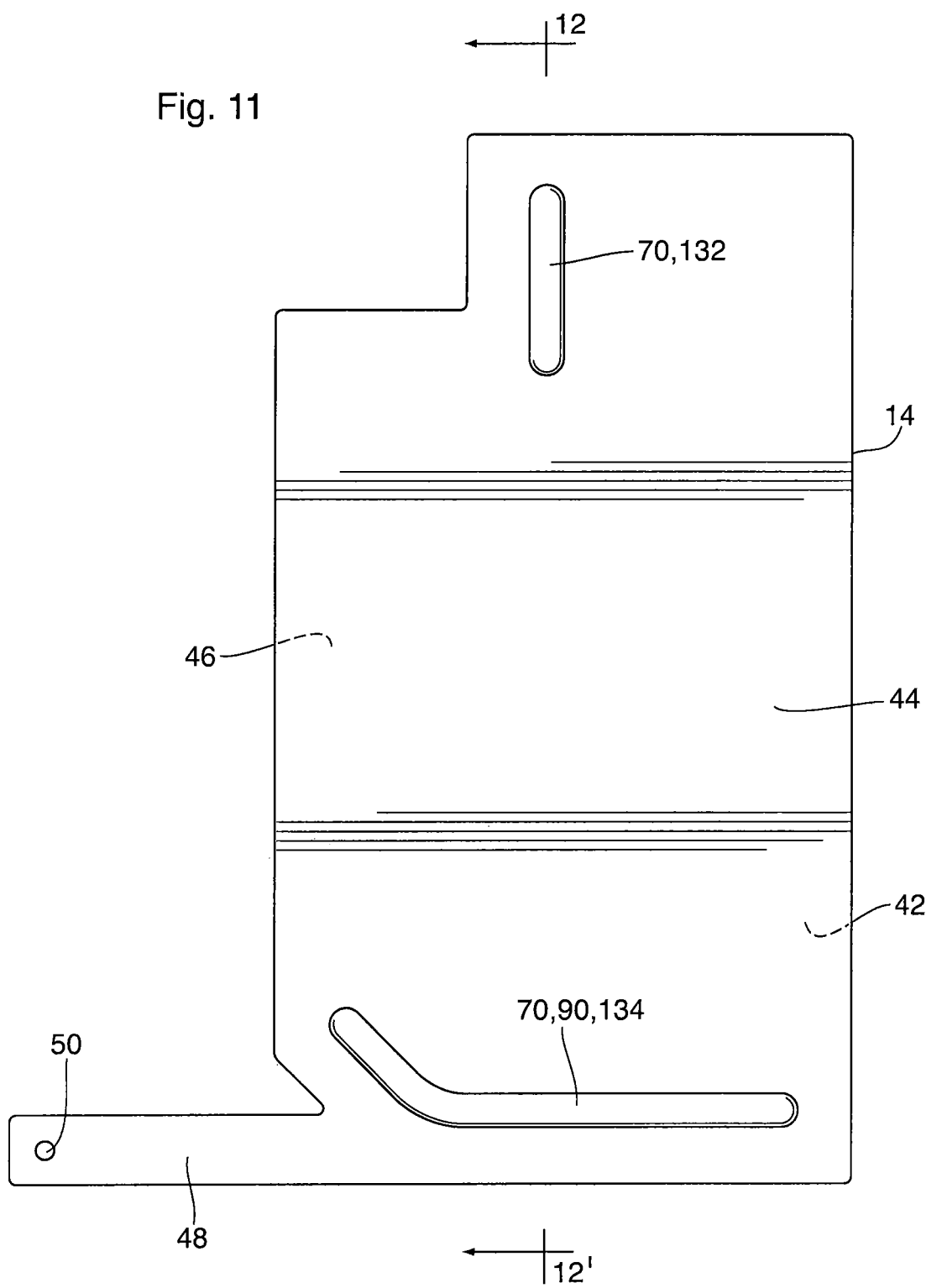
FIG. 11 is a plan view of the second plate of the heat exchanger of FIG. 10.
Figure 12:
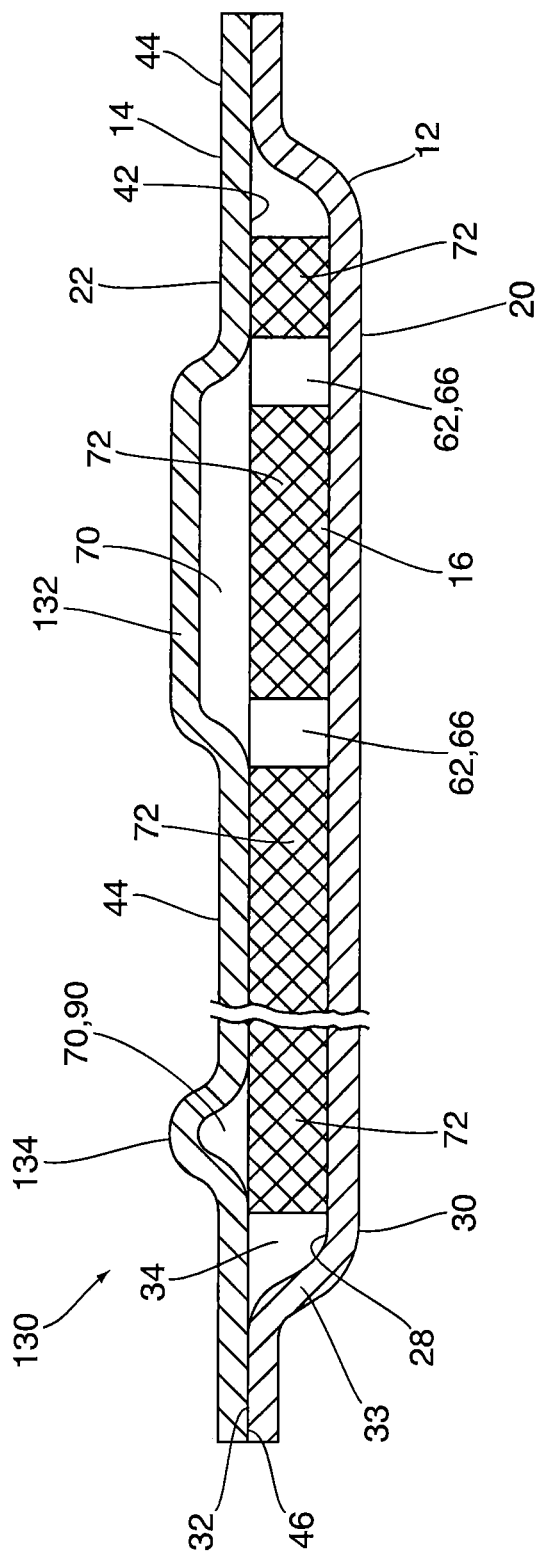
FIG. 12 is a cross-section along line 12-12 of FIGS. 10 and 11.

A heat exchanger 130 according to a fourth embodiment is now described below with reference to FIGS. 10 to 12. Heat exchanger 130 comprises a vapor chamber including a number of elements which are similar or identical to corresponding elements of vapor chambers 10, 100 and 110 described above. Like elements of vapor chamber 130 are identified by like reference numerals in the drawings and in the following description.

Figure 10:
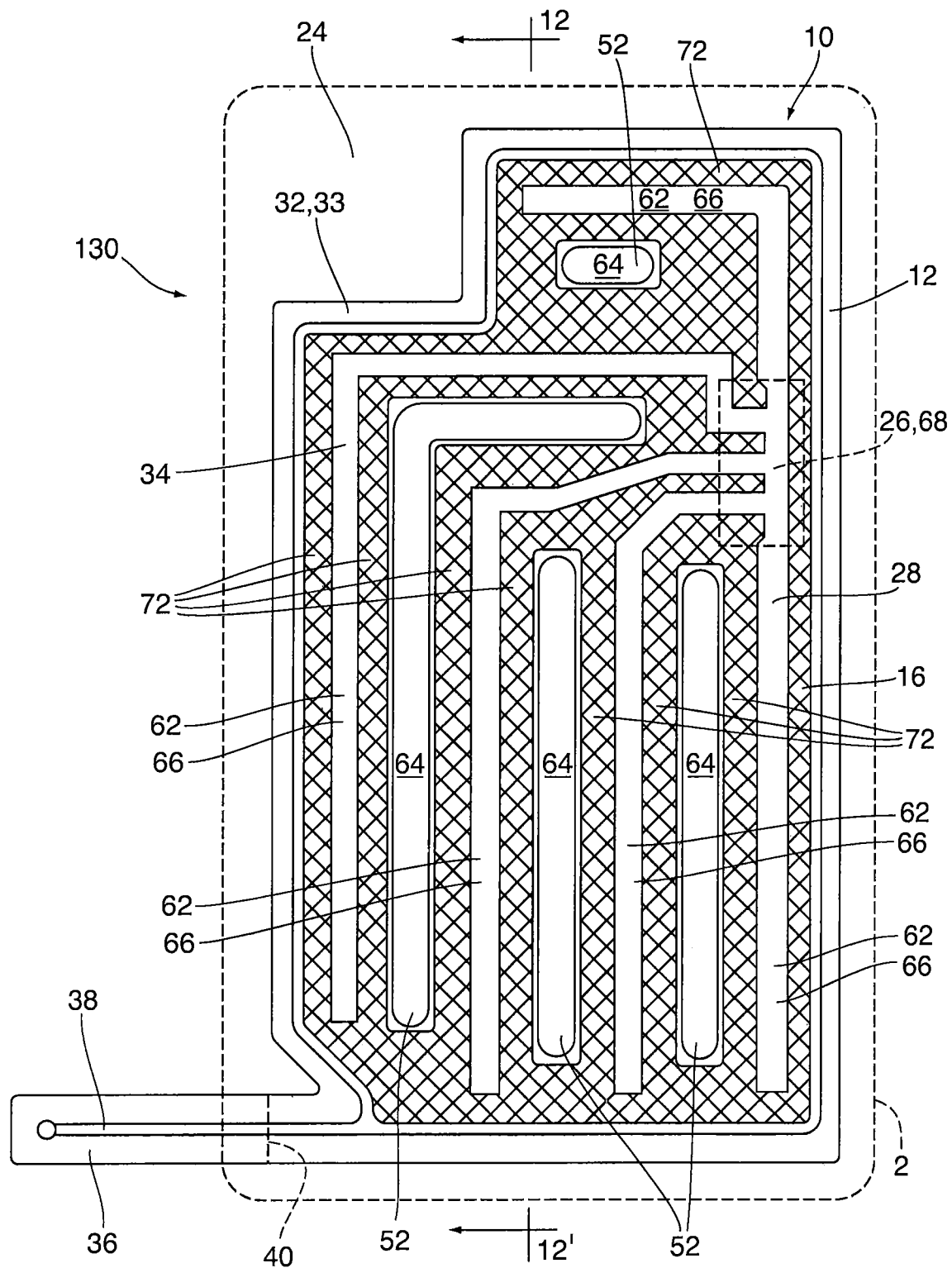
FIG. 10 is a plan view similar to FIG. 2, showing the interior of the heat exchanger according to a fourth embodiment, with the second plate removed.

FIG. 10 is a plan view of the first plate 12 and the wick material 16 of vapor chamber 130. The first plate 12 of vapor chamber 130 is the same as first plate 12 of vapor chamber 10, except that the ribs 52 are provided in the first plate 12 instead of second plate 14. The ribs 52 extend upwardly from the inner face 28 of first plate 12 and are received in the plurality of second cutouts 64 provided in the wick material 16.

The wick material 16 of vapor chamber 130 is the same as wick material 16 of vapor chamber 10, except that wick material 16 of vapor chamber 130 lacks the reduced-height, non-wicking portions which comprise the secondary gas flow passages 70. Instead, the secondary gas flow passages are provided in the second plate 14, in the form of an elongate longitudinal rib 132 and an elongate transverse rib 134 which protrude upwardly from the outer face 44 of the second plate 14, i.e. away from the fluid chamber 34 and the wick material 16.

The ribs 132, 134 create secondary gas flow passages 70 interconnecting two or more primary gas flow passages 66, thereby providing improved flow distribution of the gaseous working fluid across the surface area of vapor chamber 10. In particular, the longitudinal rib 132 forms a longitudinal secondary gas flow passage connecting the second end of the uppermost primary gas flow passage 66 in FIG. 10 to the adjacent primary gas flow passage 66. The transverse rib 134 provides a transverse gas distribution zone 90 extending transversely across the vapor chamber 130 proximate to the end of vapor chamber 10 which is distal to the evaporation zone 68. forming a transverse gas distribution zone 90 extending transversely across the vapor chamber 10 proximate to the end of vapor chamber 10 which is distal to the evaporation zone 68.

Figure 13:
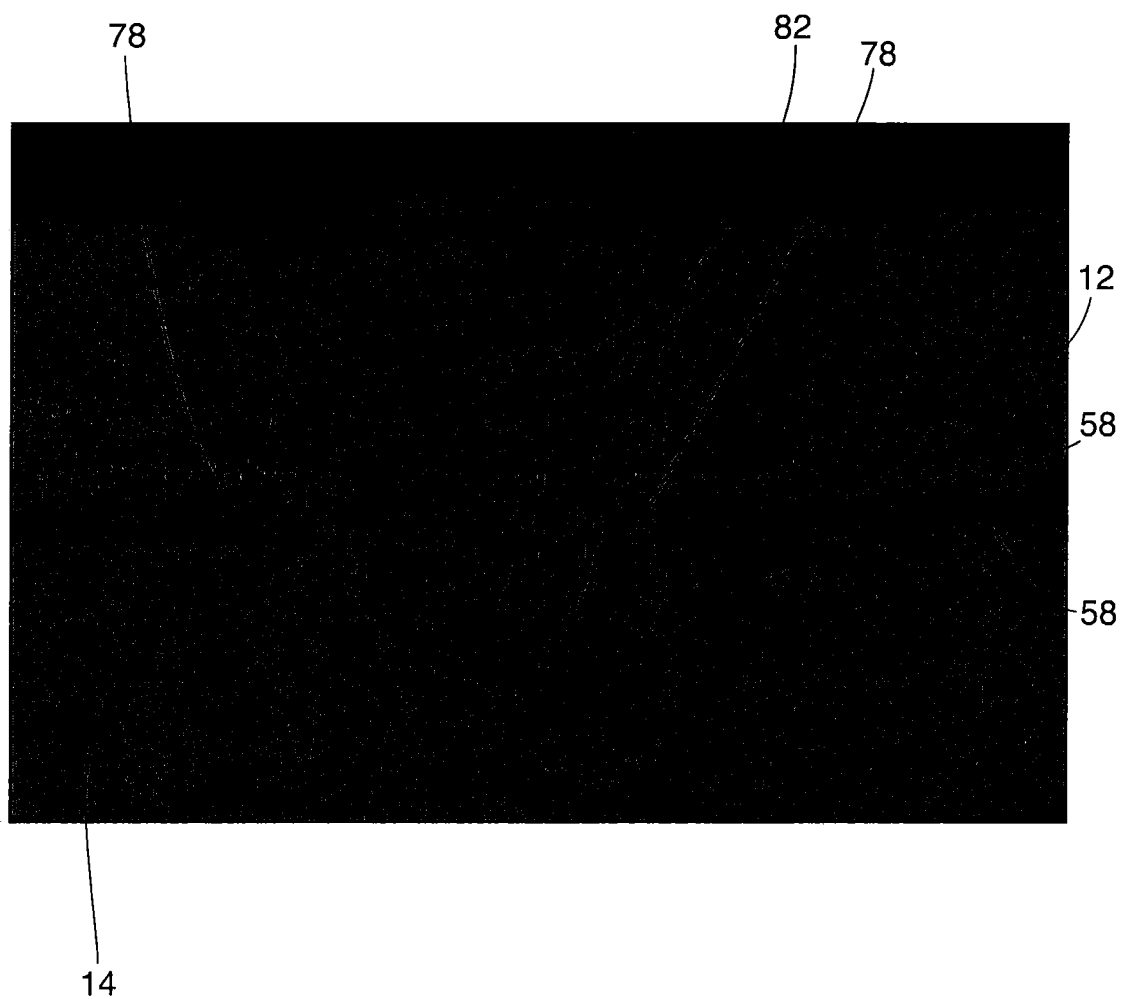
FIG. 13 is a photomicrograph of a weld joint in a heat exchanger comprising first and second sheets of copper-clad stainless steel.
Figure 14:
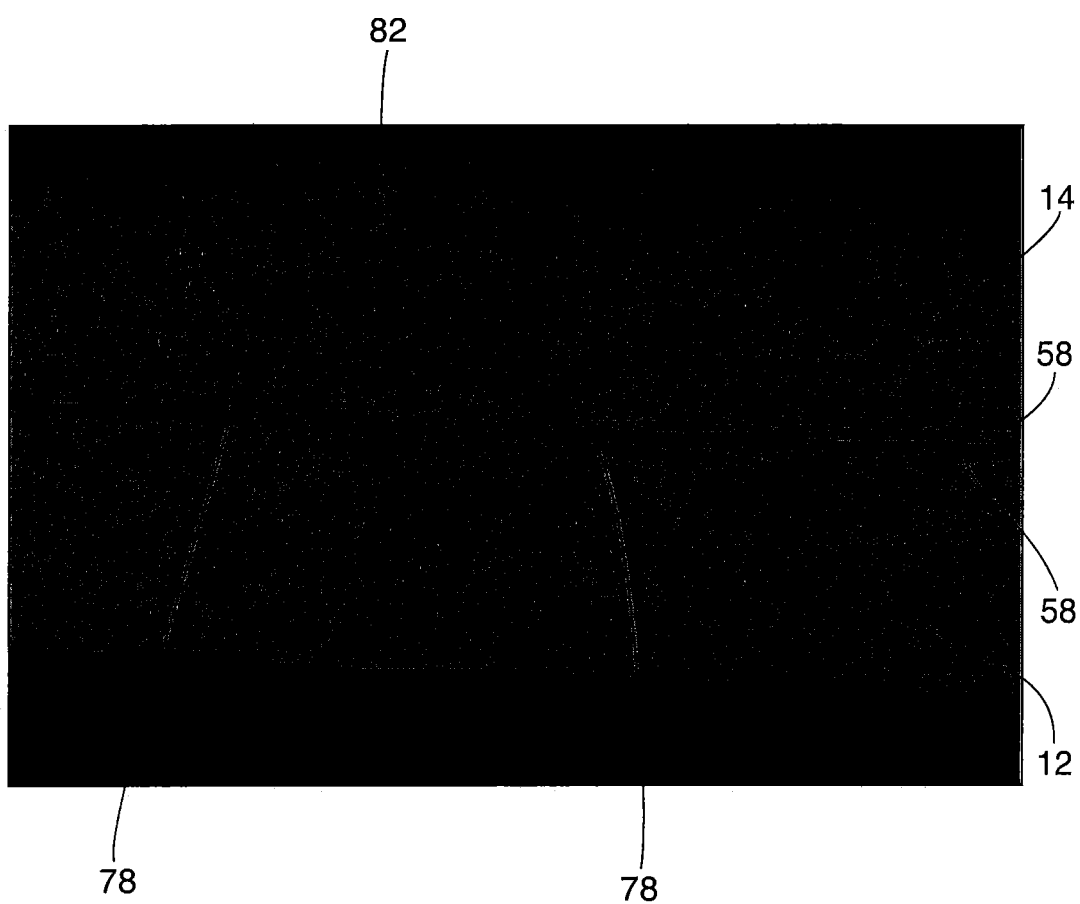
FIG. 14 is a photomicrograph of a weld joint in a heat exchanger comprising first and second sheets of nickel-clad stainless steel.

FIGS. 13 and 14 are enlarged photographs showing weld joints 82 prepared in accordance with the above-described process. In FIG. 13, the first and second sheets 12, 14 comprise stainless steel with an inner clad layer 58 of copper, and in FIG. 14 the first and second sheets 12, 14 comprise stainless steel with an inner clad layer of nickel.

While certain embodiments of heat exchangers have been described herein, it will be understood that certain adaptations and modifications of the described embodiments can be made. Therefore the embodiments described above are considered to be illustrative and not restrictive.

What is claimed is:

1. A heat exchanger for cooling a heat-generating component, the heat exchanger having an upper surface adapted for thermal contact with the heat-generating component, an opposed lower surface, and an interior defining a fluid chamber containing a working fluid, wherein the heat exchanger comprises:
    (a) a first plate having an inner face which faces toward an interior of the fluid chamber, an outer face which defines either the upper or lower surface of the heat exchanger, and an outer peripheral sealing surface on the inner face of the first plate; and
    (b) a second plate having an inner face which faces toward the interior of the fluid chamber, an outer face which defines either the upper or lower surface of the heat exchanger, and an outer peripheral sealing surface on the inner face of the second plate;
    wherein each of the first plate and the second plate comprises a core layer comprising a first metal and an inner clad layer comprising a second metal, wherein the inner clad layer is provided along the inner face of each said first and second plates;
    wherein a melting temperature of the second metal is lower than that of the first metal, the second metal is a different metal than the first metal, and the second metal is inert to the working fluid;
    wherein the outer peripheral sealing surfaces of the first and second plates are sealingly joined together, with a weld joint being formed through the outer peripheral sealing surfaces of the first and second plates and extending from a top of the first plate through the inner clad layer into the second plate, and wherein the weld joint comprises an alloy of the first metal and the second metal;
    wherein narrow areas are located immediately adjacent to the weld joint in which the outer peripheral sealing surfaces on the inner faces of the first and second plates are sealingly joined together by a layer of the second metal, said narrow areas comprising a heat-affected zone; and
    wherein the weld joint is fluidly isolated from contact with the working fluid in the fluid chamber by said layer of the second metal in the heat-affected zone; and
    further comprising a sheet of wick material received inside the fluid chamber between the inner face of the first plate and the inner face of the second plate, wherein the wick material includes a hydrophilic portion in which the wick material is uncompressed and is in contact with the inner surfaces of the first and second plates along upper and lower surfaces of the wick and a non-wicking portion wherein the wick material is compressed.

2. The heat exchanger of claim 1, wherein the outer peripheral sealing surface of one of the first plate and the second plate is formed on a raised peripheral flange thereof.

3. The heat exchanger of claim 1, wherein the first metal is stainless steel and the second metal is copper or nickel.

4. The heat exchanger of claim 1, wherein at least one of the first and second plates further comprises a continuous outer clad layer along the outer surface of the respective first or second plate, wherein the outer clad layer is comprised of a third metal; wherein the first metal is stainless steel, the second metal is copper or nickel, and the third metal is copper or nickel.

5. The heat exchanger of claim 1, wherein the wick material comprises a fine mesh of a material which is compatible with the working fluid.

6. The heat exchanger of claim 1, wherein the wick material comprises a first plurality of cutouts defining a plurality of primary gas flow passages for circulation of the working fluid in a gaseous state, and wherein portions of the wick material between the cutouts define a plurality of liquid flow passages for circulation of the working fluid in a liquid state.

7. The heat exchanger of claim 1, further comprising a plurality of reinforcing ribs extending upwardly into the fluid chamber from the inner face of the first or second plate;
    wherein each of the reinforcing ribs has a top sealing surface along which the reinforcing rib is joined to the inner face of the opposed first or second plate;
    wherein the wick material comprises a second plurality of cutouts; and
    wherein each of the ribs is received in one of the cutouts of the second plurality of cutouts.

8. The heat exchanger of claim 6, wherein the wick material further comprises one or more non-wicking areas in which the compression of the wick material of the non-wicking areas reduces a thickness of the wick material relative to a thickness of the hydrophilic portion, wherein the one or more non-wicking areas define one or more secondary gas flow passages which provide flow communication between two or more of said primary gas flow passages; and
    wherein at least one of the one or more non-wicking areas is distal from an evaporation area.

9. The heat exchanger of claim 1, wherein the heat exchanger comprises a vapor chamber and the heat-generating component is a heat-generating component of a personal electronic device selected from the group consisting of a smart phone, a tablet, and a computer.

10. A heat exchanger for cooling a heat-generating component, the heat exchanger having an upper surface adapted for thermal contact with the heat-generating component, an opposed lower surface, and an interior defining a fluid chamber containing a working fluid, wherein the heat exchanger comprises:
    (a) a first plate having an inner face which faces toward an interior of the fluid chamber, an outer face which defines either the upper or lower surface of the heat exchanger, and an outer peripheral sealing surface on the inner face of the first plate; and (b) a second plate having an inner face which faces toward the interior of the fluid chamber, an outer face which defines either the upper or lower surface of the heat exchanger, and an outer peripheral sealing surface on the inner face of the second plate;

wherein each of the first plate and the second plate comprises a core layer comprising a first metal and an inner clad layer comprising a second metal, wherein the inner clad layer is provided along the inner face of each said first and second plates;

wherein a melting temperature of the second metal is lower than that of the first metal, the second metal is a different metal than the first metal, and the second metal is inert to the working fluid;

wherein the outer peripheral sealing surfaces of the first and second plates are sealingly joined together, with a weld joint being formed through the outer peripheral sealing surfaces of the first and second plates and extending from a top of the first plate through the inner clad layer into the second plate, and wherein the weld joint comprises an alloy of the first metal and the second metal;

wherein an evaporation zone is defined in the interior of the fluid chamber, in between the first and second plates, wherein the evaporation zone directly opposes an area of the upper surface which is in contact with the heat-generating component; and wherein the heat exchanger further comprises:

a plurality of spaced-apart differently-shaped primary gas flow passages for circulation of the working fluid in a gaseous state, each of the primary gas flow passages having a first end and a second end, the first ends of the plurality of primary gas flow passages being in open flow communication with one another in the evaporation zone, and the second end of each of said primary gas flow passages being distal from the first end;

a plurality of spaced-apart liquid flow passages for circulation of the working fluid in a liquid state; and at least one secondary gas flow passage, each of which provides flow communication between the second end of one of the primary gas flow passages and at least one other of said primary gas flow passages, wherein the at least one secondary gas flow passage comprises at least in part a wick material having a second porosity, such that the second end of each of said primary gas flow passages is in flow communication with at least one other of said primary gas flow passages through said at least one secondary gas flow passage; and such that all the primary gas flow passages in said plurality of primary gas flow passages are interconnected with one another through said at least one secondary gas flow passage, optionally through one or more of said primary gas flow passages.

11. The heat exchanger of claim 10, wherein the evaporation zone is located at or proximate to a first end of the heat exchanger, and the second ends of at least some of the primary gas flow passages are located proximate to a second end of the heat exchanger, longitudinally spaced from the evaporation zone; and wherein a transverse gas distribution zone extends transversely across the heat exchanger proximate to the second end thereof, the transverse gas distribution zone being in open flow communication with the second ends of all of said primary gas flow passages having their second ends located proximate to the second end of the heat exchanger.

12. The heat exchanger of claim 10, wherein the liquid flow passages are defined by a wick material received inside the fluid chamber between the inner face of the first plate and the inner face of the second plate, wherein the wick material has a hydrophilic portion with a first thickness, and having a first porosity sufficient to permit wicking and capillary flow of the liquid working fluid through the liquid flow passages, and the first thickness being such that the hydrophilic portion of the wick material is in contact with the inner surfaces of the first and second plates along upper and lower surfaces of the wick in the liquid flow passages; and wherein the primary gas flow passages are defined by spaces between the liquid flow passages.

13. The heat exchanger of claim 12, wherein the secondary gas flow passages are defined by spaces between the liquid flow passages.

14. The heat exchanger of claim 12, wherein the wick material includes at least one non-wicking area in which the wick material has the second porosity which is less than the first porosity and a second height which is less than a first height, wherein the second porosity is insufficient to provide wicking and capillary flow of the liquid working fluid, and the second height is such that the wick material occupies only a portion of the height of the fluid chamber in the at least one non-wicking area, thereby permitting the gaseous working fluid to flow over and/or under the wick material in the at least one non-wicking area.

15. The heat exchanger of claim 14, wherein at least one of said secondary gas flow passages is defined by one of the non-wicking areas of the wick material.

16. The heat exchanger of claim 14, wherein one of said at least one non-wicking areas comprises a connecting piece which is at least partially located within the evaporation zone, and is in open flow communication with the first open ends of the primary gas flow passages.

17. The heat exchanger of claim 11, comprising two of said evaporation zones which are spaced apart from each another, and both being located proximate to the first end of the heat exchanger.

18. The heat exchanger of claim 10, wherein each of the secondary gas flow passages comprises a raised rib formed in one of the first plate or the second plate.

19. A method for manufacturing a heat exchanger according to claim 1, comprising:

(a) forming a plate assembly comprising the first plate and the second plate, wherein the first and second plates are positioned with their inner faces facing toward one another, and with the peripheral sealing surface of the first plate in direct contact with the peripheral sealing surface of the second plate;

(b) directing a laser beam at an area of the plate assembly along the sealing surfaces between an outer peripheral edge of the plate assembly and an outer edge of the fluid chamber, wherein the laser beam produces a narrow fusion zone in the area where it strikes the sealing surfaces of the plates, the fusion zone extending through one of the first and second plates and at least partially through the adjoining one of the first and second plates, wherein the fusion zone contains a molten metal mixture comprising the first metal and the second metal;

(c) allowing the fusion zone to cool and solidify to form a weld joint between the first and second plates;

wherein, during step (b) the heat of the laser beam at least partly melts and fuses together the second metal of the inner clad layers of the first and second plates in a heat affected zone located immediately adjacent to the weld joint; and wherein, during step (c) the molten second metal in the heat-affected zone solidifies to form a solid layer of the second metal in the heat affected zone, wherein the layer of second metal fluidly isolates the weld joint from contact with the working fluid in the fluid chamber.

\* \* \* \* \*